US012561036B2

(12) United States Patent
    Kim et al.

(10) Patent No.:     US 12,561,036 B2
(45) Date of Patent:       Feb. 24, 2026

(54) DISPLAY DEVICE

(71) Applicant: SAMSUNG DISPLAY CO., LTD.,
                Yongin-si (KR)

(72) Inventors: Sun Ho Kim, Yongin-si (KR); **Sun Hee
                Lee, Yongin-si (KR); Gun Hee Kim**,
                Yongin-si (KR); Tae Hoon Yang,
                Yongin-si (KR); Seung Chan Lee,
                Yongin-si (KR); Joo Hee Jeon,
                Yongin-si (KR)

(73) Assignee: SAMSUNG DISPLAY CO., LTD.,
               Gyeonggi-do (KR)

( * ) Notice:   Subject to any disclaimer, the term of this
                patent is extended or adjusted under 35
                U.S.C. 154(b) by 0 days.

(21) Appl. No.: 18/915,541

(22) Filed:     Oct. 15, 2024

(65)            Prior Publication Data
        US 2025/0040343 A1      Jan. 30, 2025

Related U.S. Application Data

(60) Division of application No. 18/117,587, filed on Mar.
     6, 2023, now Pat. No. 12,161,016, which is a
                    (Continued)

(30)        Foreign Application Priority Data

Jan. 17, 2020    (KR) ........................ 10-2020-0006777

(51) Int. Cl.
     G06F 3/041          (2006.01)
     G06F 3/044          (2006.01)
                    (Continued)

(52) U.S. Cl.
     CPC .......... G06F 3/0446 (2019.05); G06F 3/0412
                    (2013.01); G06F 3/0443 (2019.05);
                    (Continued)

(58) Field of Classification Search
     None
     See application file for complete search history.

(56)            References Cited

U.S. PATENT DOCUMENTS 10,068,939 B2    9/2018  Ishiwata
    10,168,844 B2    1/2019  Kwon et al.
                    (Continued)

FOREIGN PATENT DOCUMENTS

FR          2957685 A1       9/2011
    KR      1020170088474 A      8/2017
                    (Continued)

*Primary Examiner* — Duane N Taylor, Jr.
(74) *Attorney, Agent, or Firm* — CANTOR COLBURN
LLP

(57)            ABSTRACT

A display device includes a display panel including an
antireflection layer on a light emitting element layer which
includes a first pixel defining layer in which an opening
defining a light emitting area of a first pixel is defined, and
a second pixel defining layer in which an opening defining
a light emitting area of a second pixel is defined. The
antireflection layer includes first and second light blocking
layers respectively overlapping the first and second pixel
defining layers, and includes a first gap defined by a length
of a predetermined direction from an edge of the opening to
an edge of an opening of the first light blocking layer, and
a second gap defined by a length from an edge of the opening
to an edge of an opening of the second light blocking layer
in the predetermined direction. The first gap is less than the
second gap.

7 Claims, 15 Drawing Sheets

Related U.S. Application Data continuation of application No. 17/678,576, filed on Feb. 23, 2022, now Pat. No. 11,600,805, which is a division of application No. 17/122,405, filed on Dec. 15, 2020, now Pat. No. 11,302,900.

(51) Int. Cl.

| | |
|---|---|
| *H04N 23/57* | (2023.01) |
| *H10K 59/122* | (2023.01) |
| *H10K 59/123* | (2023.01) |
| *H10K 59/124* | (2023.01) |
| *H10K 59/38* | (2023.01) |
| *H10K 59/40* | (2023.01) |
| *H10K 59/80* | (2023.01) |
| *H10K 59/65* | (2023.01) |

(52) U.S. Cl.
CPC ............. *H04N 23/57* (2023.01); *H10K 59/38* (2023.02); *H10K 59/40* (2023.02); *H10K 59/8792* (2023.02); *G06F 2203/04111* (2013.01); *G06F 2203/04112* (2013.01); *H10K 59/122* (2023.02); *H10K 59/65* (2023.02); *H10K 59/8731* (2023.02)

(56) References Cited

U.S. PATENT DOCUMENTS

| 11,003,287 | B2 | 5/2021 | Clark et al. |
|---|---|---|---|
| 11,081,676 | B2 | 8/2021 | Kim et al. |
| 11,335,764 | B2 | 5/2022 | Her et al. |
| 2006/0220025 | A1 | 10/2006 | Oh |
| 2016/0216802 | A1 | 7/2016 | Bao et al. |
| 2017/0287992 | A1 | 10/2017 | Kwak et al. |
| 2017/0338289 | A1 | 11/2017 | Seo et al. |
| 2018/0033832 | A1 | 2/2018 | Park et al. |
| 2018/0182819 | A1 | 6/2018 | Jo et al. |
| 2018/0308903 | A1 | 10/2018 | Jeong et al. |
| 2018/0373913 | A1 | 12/2018 | Panchawagh et al. |
| 2020/0026373 | A1 | 1/2020 | Lee et al. |
| 2021/0005845 | A1 | 1/2021 | Kim et al. |
| 2021/0202592 | A1 | 7/2021 | Kim et al. |

FOREIGN PATENT DOCUMENTS

| KR | 1020170111827 A | 10/2017 |
|---|---|---|
| KR | 1020180074985 A | 7/2018 |
| KR | 1020190063029 A | 6/2019 |
| KR | 1020190119960 A | 10/2019 |

NDA⎫
       ⎬MA
DA ⎭

VII                    VII'

300

BA ⎫
      ⎬PA
PDA ⎭

311
310⎰
312

330    320

DR2
↑
●→DR1
DR3

DISPLAY DEVICE

This application is a divisional of U.S. patent application Ser. No. 18/117,587, filed on Mar. 6, 2023, which is a continuation of U.S. patent application Ser. No. 17/678,576, filed on Feb. 23, 2022, which is a divisional of U.S. patent application Ser. No. 17/122,405, filed on Dec. 15, 2020, which claims priority to Korean Patent Application No. 10-2020-0006777, filed on Jan. 17, 2020, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

As information society develops, demand for a display device for displaying an image is increasing in various forms. The display device is applied to various electronic devices such as a smart phone, a digital camera, a notebook computer, a navigation device, and a smart television. The display device may be a flat panel display device such as a liquid crystal display device, a field emission display device, or an organic light emitting display device.

The display device may include a display panel including a plurality of pixels connected to scan lines, data lines, and power lines to display an image. In addition, the display device may include a proximity sensor for sensing whether a user is positioned near a front surface of the display device, an illuminance sensor for sensing an illuminance of the front surface of the display device, an iris sensor for recognizing an iris of the user, a camera device for shooting a still image and a video, and the like.

As display device is applied to various electronic devices, display devices having various designs are desired. In a case of a smart phone, for example, a display device capable of widening the display area by removing holes defined in the front surface of the display device is desired. In this case, sensor devices that have been disposed in the holes defined in the front surface of the display device may overlap the display panel.

SUMMARY

Embodiments of the invention provide a display device capable of minimizing an optical characteristic difference between a first area in which a lower panel sensor is disposed and a second area that is a remaining area.

In addition, embodiments of the invention provide a display device capable of preventing a luminance reduction and reducing a thickness of the display panel.

A display device in an embodiment includes a display panel including a first area in which first pixels are defined and a second area in which second pixels are defined, and an under panel sensor overlapping the first area in a thickness direction. The display panel includes a light emitting element layer, and an antireflection layer disposed on the light emitting element layer. The light emitting element layer includes a first pixel defining layer in which an opening defining a light emitting area of the first pixel is defined, and a second pixel defining layer in which an opening defining a light emitting area of the second pixel is defined. The antireflection layer includes a first light blocking layer overlapping the first pixel defining layer, and a second light blocking layer overlapping the second pixel defining layer. A first gap is defined in the display device by a length from an edge of the opening of the first pixel defining layer to an edge of an opening of the first light blocking layer in a predetermined direction, and a second gap is defined in the display device in the display device by a length from an edge of the opening of the second pixel defining layer to an edge of an opening of the second light blocking layer in the predetermined direction. The first gap is less than the second gap.

In an embodiment, the display device may further include a thin film encapsulation layer disposed between the light emitting element layer and the antireflection layer, and a minimum thickness of the thin film encapsulation layer of the first area may be less than a minimum thickness of the thin film encapsulation layer of the second area.

In an embodiment, the thin film encapsulation layer may further include a first encapsulation layer, a second encapsulation layer disposed on the first encapsulation layer, and a third encapsulation layer disposed between the first encapsulation layer and the second encapsulation layer, and a minimum thickness of the third encapsulation layer of the first area may be less than a minimum thickness of the third encapsulation layer of the second area.

In an embodiment, the first gap and the second gap may be determined based on the following equation.

$$G2 = G1 + a \times D_{TFE3}$$

Here, G2 may represent the second gap, G1 may represent the first gap, DTFE3 may represent a difference between the minimum thickness of the third encapsulation layer of the first area and the minimum thickness of the third encapsulation layer of the second area, and a may represent a variable set in a range of about 0.4 to about 0.6.

In an embodiment, the first area may further include a light transmitting portion that does not overlap the first pixels, and the under panel sensor may overlap the light transmitting portion in the thickness direction.

In an embodiment, the under panel sensor may include an image sensor receiving light provided through the light transmission portion as a camera device.

In an embodiment, the antireflection layer may further include a first color filter overlapping the first pixel, and a second color filter overlapping the second pixel, and the first color filter may be disposed in the opening of the first light blocking layer, and the second color filter may be disposed in the opening of the second light blocking layer.

In an embodiment, the first pixels may include a first sub pixel emitting a first color, a second sub pixel emitting a second color, and a third sub pixel emitting a third color, and the first color filter may include a first sub color filter overlapping the first sub pixel, a second sub color filter overlapping the second sub pixel, and a third sub color filter overlapping the third sub pixel.

In an embodiment, a distance between ends of the first light blocking layer adjacent to the first color filter in the predetermined direction may be greater than a distance between ends of the second light blocking layer adjacent to the second color filter.

In an embodiment, the number of the first pixels per unit area may be less than the number of the second pixels.

In an embodiment, a size of the first area may be less than a size of the second area.

In an embodiment, a width of the first pixel defining layer in the predetermined direction may be substantially the same as a width of the second pixel defining layer in the predetermined direction.

In an embodiment, a thickness of the second pixel defining layer may be greater than a thickness of the first pixel defining layer.

A display device in another embodiment includes a display panel including a first area in which first pixels are defined and a second area in which second pixels are defined, and an under panel sensor overlapping the first area in a thickness direction. The display panel may include a light emitting element layer, a thin film encapsulation layer covering the light emitting element layer, a sensing layer disposed on the thin film encapsulation layer, and including sensing electrodes, a first insulating layer, a second insulating layer disposed on the first insulating layer, and a planarization layer disposed between the first insulating layer and the second insulating layer, and an antireflection layer disposed on the sensing layer. The light emitting element layer may include a first pixel defining layer defining a light emitting area of the first pixel. The antireflection layer may include a first light blocking layer overlapping the first pixel defining layer. A width of the first light blocking layer in the predetermined direction may be less than a width of the first pixel defining layer in the predetermined direction. A thickness of the thin film encapsulation layer of the first pixel may be less than a thickness of the thin film encapsulation layer of the second pixel.

In an embodiment, the sensing layer may further include a first conductive layer disposed on the second insulating layer, a second conductive layer disposed on the first conductive layer, and a contact layer disposed between the first conductive layer and the second conductive layer, and the second conductive layer may be electrically connected to the first conductive layer through a contact hole passing through the contact layer.

In an embodiment, the contact layer may not overlap the under panel sensor.

In an embodiment, the contact layer and the planarization layer may include a same material.

In an embodiment, the contact layer may overlap the under panel sensor.

In an embodiment, the sensing layer may further include a protective layer disposed between the second conductive layer and the antireflection layer, and the protective layer may include a material identical to the same material of the contact layer and the planarization layer.

In an embodiment, a thickness of the planarization layer of the first area may be greater than a thickness of the planarization layer of the second area.

Specific details of other embodiments are included in the detailed description and drawings.

According to the display device in an embodiment, an optical characteristic difference between the first area and the second area may be minimized by differently designing gaps between the pixel defining layer and the light blocking layer in the first area in which the under panel sensor is disposed and the second area that is the remaining area.

In addition, a separate polarizing plate may be omitted by disposing the antireflection layer including the color filter and the light block layer. Therefore, a luminance reduction may be prevented and a thickness of the display device may be minimized.

Effects by embodiments are not limited by the contents illustrated above, and more various effects are included in the specification.

BRIEF DESCRIPTION OF THE DRAWINGS

The above and other features of the invention will become more apparent by describing in further detail embodiments thereof with reference to the accompanying drawings, in which:

FIGS. 3 and 4 are plan views of an embodiment of a display panel;

DETAILED DESCRIPTION

Figure 1:
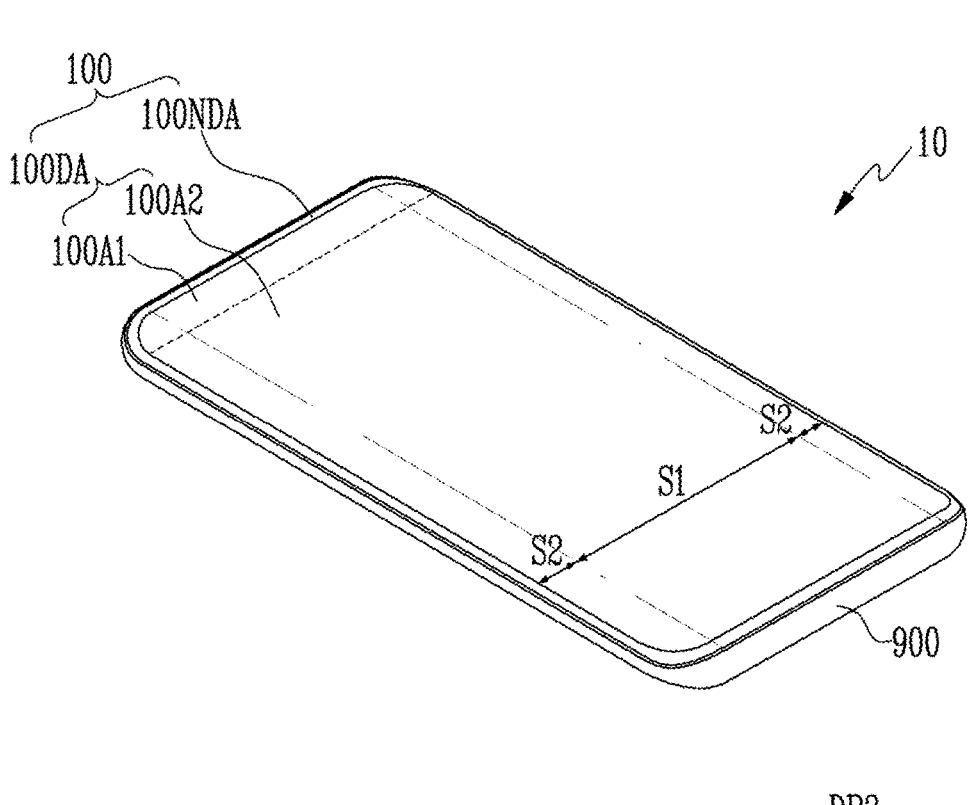
FIG. 1 is a perspective view of an embodiment of a display device.
Figure 1:

The advantages and features of the invention and a method of achieving them will become apparent with reference to the embodiments described in detail below together with the accompanying drawings. However, the invention is not limited to the embodiments disclosed below, and may be implemented in various different forms. The embodiments are provided so that the invention will be thorough and complete and those skilled in the art to which the invention pertains can fully understand the scope of the invention.

A case in which an element or a layer is referred to as "on" another element or layer includes a case in which another layer or another element is disposed directly on the other element or between the other layers. The same reference numerals denote to the same components throughout the specification. A shape, a size, a ratio, an angle, the number, and the like disclosed in the drawings for describing the embodiments are exemplary, and thus, the invention is not limited thereto.

Although a first, a second, and the like are used to describe various components, these components are not limited by these terms. These terms are used only to distinguish one component from another component. Therefore, a first component mentioned below may be a second component within the technical spirit of the invention.

Each of features of various embodiments of the invention may be coupled or combined with each other in part or in whole, and technically various interlocking and driving are possible. Each embodiment may be implemented independently of each other and association thereof may be implemented together.

Hereinafter, specific embodiments will be described with reference to the accompanying drawings.

In the specification, a first direction DR1 indicates an X-axis direction, a second direction DR2 indicates a Y-axis direction, and a third direction DR3 indicates a Z-axis direction.

Figure 2:
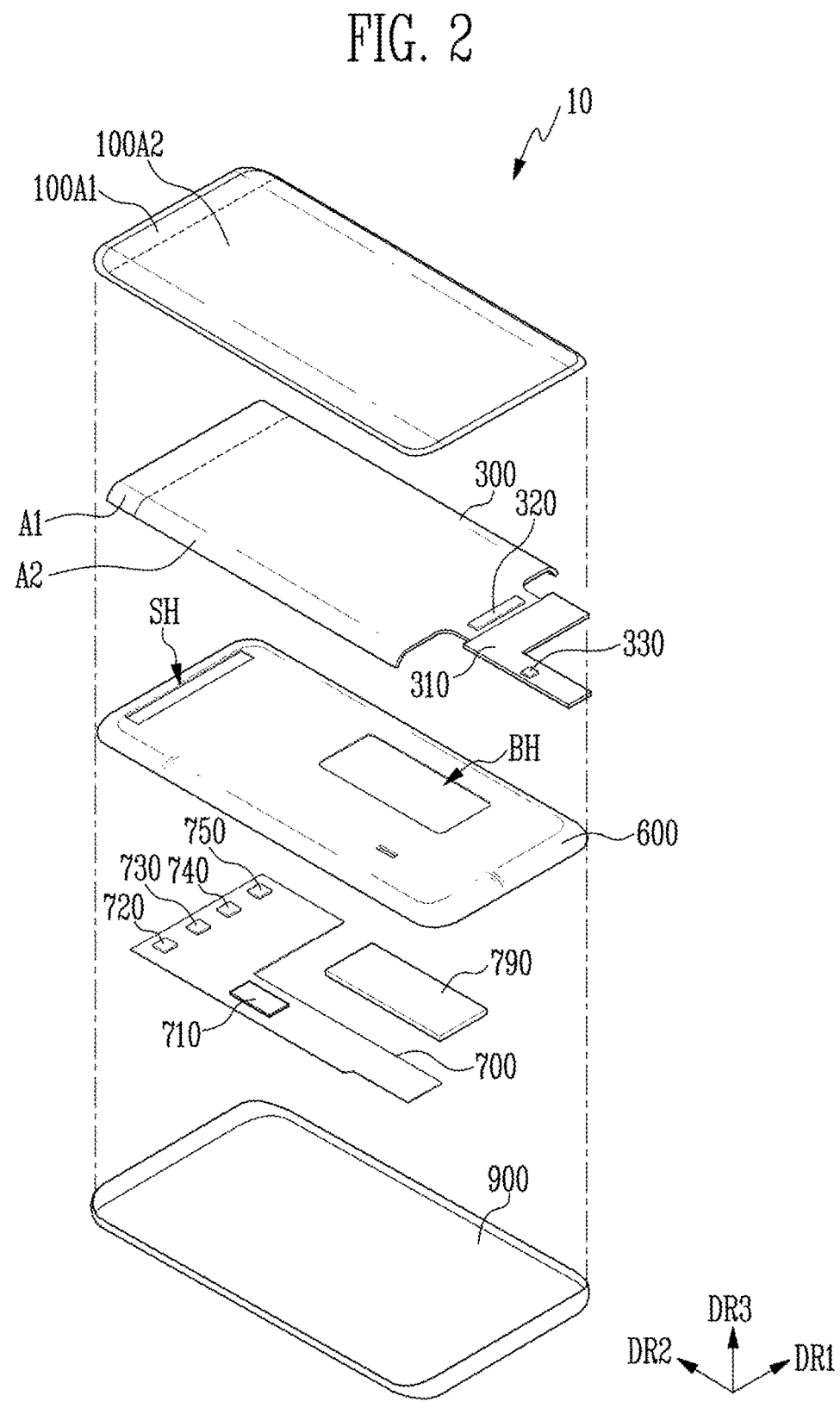
FIG. 2 is an exploded perspective view of the display device of FIG. 1.

FIG. 1 is a perspective view of an embodiment of a display device. FIG. 2 is an exploded perspective view of the display device of FIG. 1.

Referring to FIGS. 1 and 2, the display device 10 in an embodiment is a device for displaying a video or a still image. The display device 10 may be used as a display screen of various products such as a portable electronic device such as a mobile phone, a smart phone, a tablet personal computer ("PC"), a smart watch, a watch phone, a mobile communication terminal, an electronic notebook, an electronic book, a portable multimedia player ("PMP"), a navigation device, and an ultra mobile PC ("UMPC"), but also a television, a notebook computer, a monitor, a billboard, and Internet of things ("IoT").

The display device 10 may have a planar quadrangular (e.g., rectangular) shape. In an embodiment, the display device 10 may have a planar rectangular shape including a short side of the first direction DR1 and a long side of the second direction DR2 as shown in FIGS. 1 and 2. A corner where the short side of the first direction DR1 and the long side of the second direction DR2 meet may be rounded to have a predetermined curvature or may have a right angle. The planar shape of the display device 10 is not limited to a rectangle, and may include various other shapes such as polygon, a circle, or an ellipse.

The display device 10 may include a first surface S1 which is flat and a second surface S2 extending from left and right sides of the first surface S1. The second surface S2 may be flat or may include a curved surface. When the second surface S2 is flat, an angle defined by the first surface S1 and the second surface S2 may be an obtuse angle. When the second surface S2 includes the curved surface, the second surface S2 may have a predetermined curvature or have a changing curvature.

In FIG. 1, the second surface S2 extends from each of the left and right sides of the first surface S1, but is not limited thereto. That is, the second surface S2 may extend only from one side of the left and right sides of the first surface S1. In addition, the second surface S2 may extend from at least one of upper and lower sides as well as the left and right sides of the first surface S1. Hereinafter, description will be given based on an example in which the second surface S2 is disposed at left and right side edges of the display device 10.

The display device 10 includes a cover window 100, a display panel 300, a bracket 600, a main circuit board 700, and a lower cover 900.

The cover window 100 may be disposed on the display panel 300 to cover an upper surface of the display panel 300. Therefore, the cover window 100 may function to protect the upper surface of the display panel 300.

The cover window 100 may be disposed on the first surface S1 and the second surface S2.

The cover window 100 may include a light transmitting portion 100DA corresponding to the display panel 300 and a light blocking portion 100NDA corresponding to an area other than the display panel 300.

The light transmitting portion 100DA may be disposed on a portion of the first surface S1 and a portion of the second surface S2. The light blocking portion 100NDA may be opaque. In an alternative embodiment, the light blocking unit 100NDA may be provided as a deco layer including a pattern that may be shown to a user.

The light transmitting portion 100DA may include a first light transmitting portion 100A1 corresponding to a first area A1 of the display panel 300, which will be described later, and a second light transmitting portion 100A2 corresponding to a second area A2 of the display panel 300.

The display panel 300 may be disposed under the cover window 100. The display panel 300 may overlap the light transmitting portion 100DA of the cover window 100.

The display panel 300 may be disposed on the first surface S1 and the second surface S2. Therefore, an image of the display panel 300 may be seen not only on the first surface S1 but also on the second surface S2.

The display panel 300 may include the first area A1 and the second area A2. The first area A1 may overlap the first light transmitting portion 100A1 of the cover window 100. The second area A2 may overlap the second light transmitting portion 100A2 of the cover window 100. The first area A1 may be disposed on one side of the second area A2, for example, on an upper side of the second area A2 as shown in FIG. 2, but is not limited thereto.

The display panel 300 may be a light emitting display panel including a light emitting element. In an embodiment, the display panel 300 may be an organic light emitting display panel using an organic light emitting diode including an organic light emitting layer, a micro light emitting diode ("LED") display panel using a micro LED, a quantum dot light emitting display panel using a quantum dot light emitting diode including a quantum dot light emitting layer, or an inorganic light emitting display panel using an inorganic light emitting element including an inorganic semiconductor, for example. Hereinafter, the description will be given based on an example in which the display panel 300 is the organic light emitting display panel.

A display circuit board 310 and a display driving circuit 320 may be attached to one side of the display panel 300. One end of the display circuit board 310 may be attached on pads provided on one side of the display panel 300 using an anisotropic conductive film. In an embodiment, the display circuit board 310 may be a flexible printed circuit board ("FPCB") that may be bent, for example, but is not limited thereto. In an embodiment, the display circuit board 310 may include a first portion 311 extending in the first direction DR1 and a second portion 312 extending in the second direction DR2.

The display driving circuit 320 may receive control signals and power voltages through the display circuit board 310, and generate and output signals and voltages for driving the display panel 300. In an embodiment, the display driving circuit 320 may be provided as an integrated circuit ("IC"), for example. The display driving circuit 320 may be disposed on the display panel 300. In an embodiment, the display driving circuit 320 may be attached on the display panel 300 by a chip on glass ("COG") method, a chip on plastic ("COP") method, or an ultrasonic method, for example. In an alternative embodiment, the display driving circuit 320 may be disposed on the display circuit board 310.

A sensing driver 330 may be disposed on the display circuit board 310. In an embodiment, the sensing driver 330 may include an IC, for example. The sensing driver 330 may be attached on the display circuit board 310.

The sensing driver 330 may be electrically connected to sensing electrodes of a sensing layer of the display panel 300 through the display circuit board 310. The sensing driver 330 may determine whether the user touches thereon by applying driving signals to driving electrodes among the sensing electrodes and sensing a voltage charged in a mutual capacitance (hereinafter referred to as "mutual capacitance") between the driving electrodes and sense electrodes through the sense electrodes of the sensing electrodes. In this case, the touch of the user may include a contact touch and a proximity touch. The contact touch indicates that a user's finger or an object such as a pen directly contacts the cover window 100 of the display device 10 disposed on the sensing layer. The proximity touch indicates that a user's finger or an object such as a pen is positioned to be closely spaced apart from one surface of the display device 10, such as hovering.

A bracket 600 may be disposed under the display panel 300. In an embodiment, the bracket 600 may include plastic, metal, or both of plastic and metal, for example.

A sensor hole SH in which under panel sensors 720, 730, 740, and 750 are disposed, and a battery hole BH in which a battery 790 is disposed may be defined in the bracket 600. The sensor hole SH and the battery hole BH may pass through the bracket 600 in a thickness direction. The sensor hole SH may overlap the first area A1 of the display panel 300.

The main circuit board 700 and the battery 790 may be disposed under the bracket 600. In an embodiment, the main circuit board 700 may be a printed circuit board ("PCB") or an FPCB, for example.

The main circuit board 700 may include a main processor 710 and the under panel sensors 720, 730, 740, and 750. The under panel sensors 720, 730, 740, and 750 may be disposed on an upper surface of the main circuit board 700. The under panel sensors 720, 730, 740, and 750 may overlap the first area A1 of the display panel 300.

The main processor 710 may control all functions of the display device 10. In an embodiment, the main processor 710 may output digital video data to the display driving circuit 320 through the display circuit board 310 so that the display panel 300 displays an image, for example. In addition, the main processor 710 may receive sensing data from the sensing driver 330, determine touch coordinates of the user, and then execute an application indicated by an icon displayed on the touch coordinates of the user. In addition, the main processor 710 may control the display device 10 according to sensing signals input from the under panel sensors 720, 730, 740, and 750.

The under panel sensors 720, 730, 740, and 750 may include a proximity sensor 720, an illuminance sensor 730, an iris sensor 740, and a camera device 750.

The proximity sensor 720 may sense whether an object is positioned close to an upper surface of the display device 10. The proximity sensor 720 may include a light source that outputs light and a light receiver that receives light reflected by the object. The proximity sensor 720 may determine whether the object positioned close to the upper surface of the display device 10 exists according to an amount of light reflected by the object. Therefore, the proximity sensor 720 may generate a proximity sensor signal and output the proximity sensor signal to the main processor 710.

The illuminance sensor 730 may sense brightness of the upper surface of the display device. To this end, the illuminance sensor 730 may include a resistor of which a resistance value changes according to brightness of incident light. The illuminance sensor 730 may determine the brightness of the upper surface of the display device according to the resistance value of the resistor. The illuminance sensor 730 may generate an illuminance sensor signal according to the brightness of the upper surface of the display device and output the illuminance sensor signal to the main processor 710.

The iris sensor 740 may sense whether an image obtained by imaging an iris of the user is the same as an iris image that is previously stored in a memory. Therefore, the iris sensor 740 may generate an iris sensor signal and output the iris sensor signal to the main processor 710.

The camera device 750 may process an image frame such as a still image or a moving image obtained by the image sensor in a camera mode, and output the processed image frame to the main processor 710. The camera device 750 may include an image sensor that receives light provided through the light transmitting portion of the first area A1. In FIG. 2, the proximity sensor 720, the illuminance sensor 730, the iris sensor 740, and the camera device 750 are illustrated as the under panel sensors 720, 730, 740, and 750, but are not necessarily limited thereto, and the under panel sensors 720, 730, 740, and 750 may further include an infrared sensor and/or an ultrasonic sensor.

Detailed description of the light transmitting portion of the first area A1 will be described later with reference to FIG. 13.

The battery 790 may be disposed not to overlap the main circuit board 700 in the third direction DR3. The battery 790 may overlap the battery hole BH of the bracket 600.

The lower cover 900 may be disposed under the main circuit board 700 and the battery 790. The lower cover 900 may be fastened and fixed to the bracket 600. The lower cover 900 may form an outer appearance of a lower surface of the display device 10. In an embodiment, the lower cover 900 may include plastic, metal, or both of plastic and metal, for example.

Figure 3:
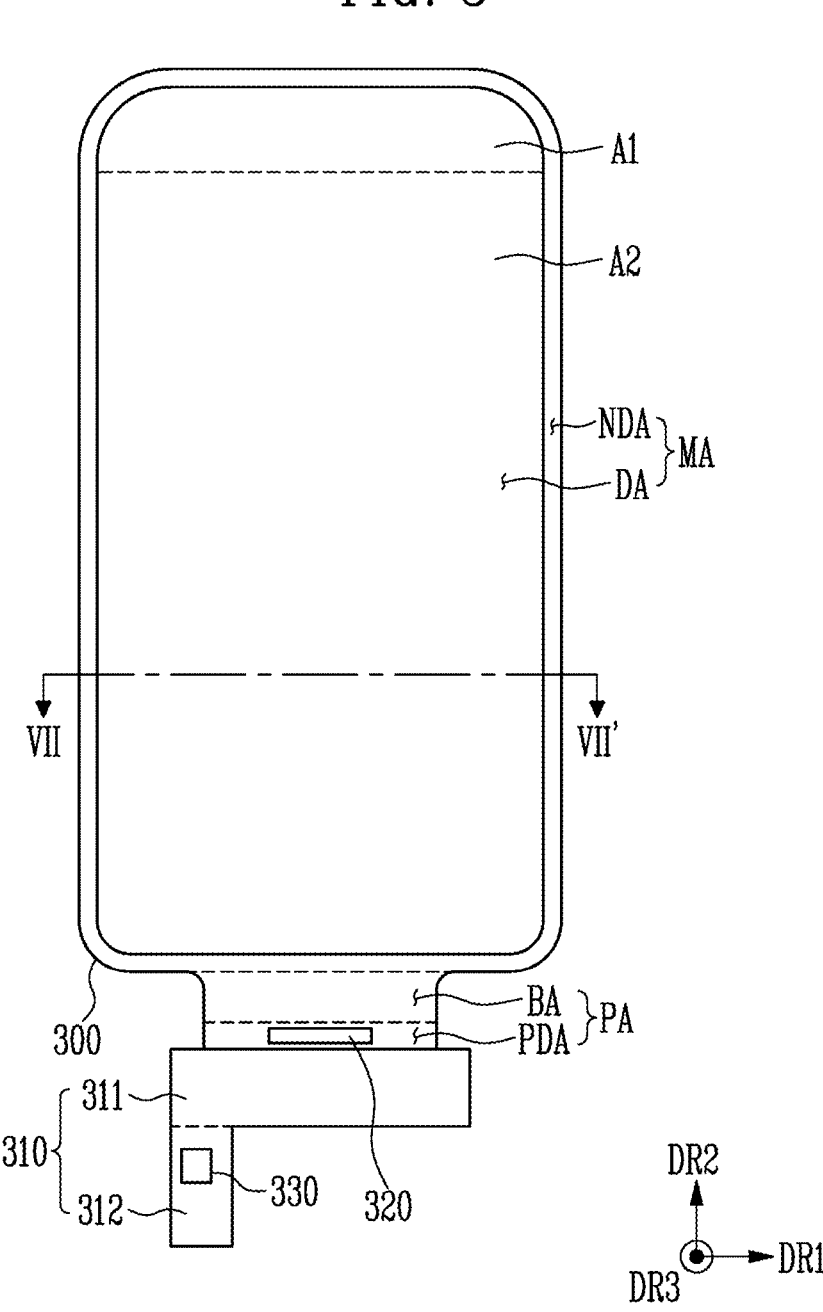
Figure 4:
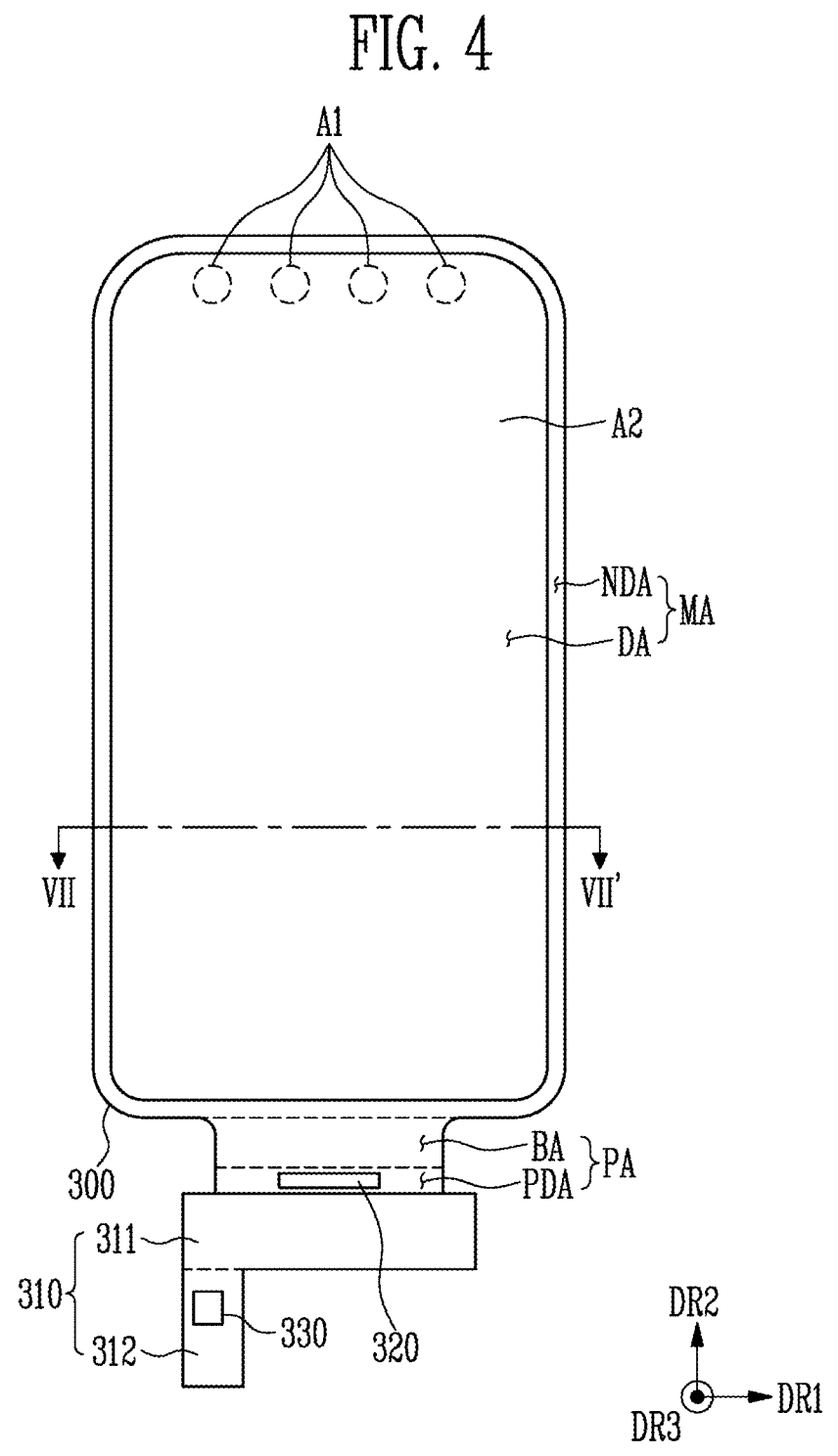
Figure 5:
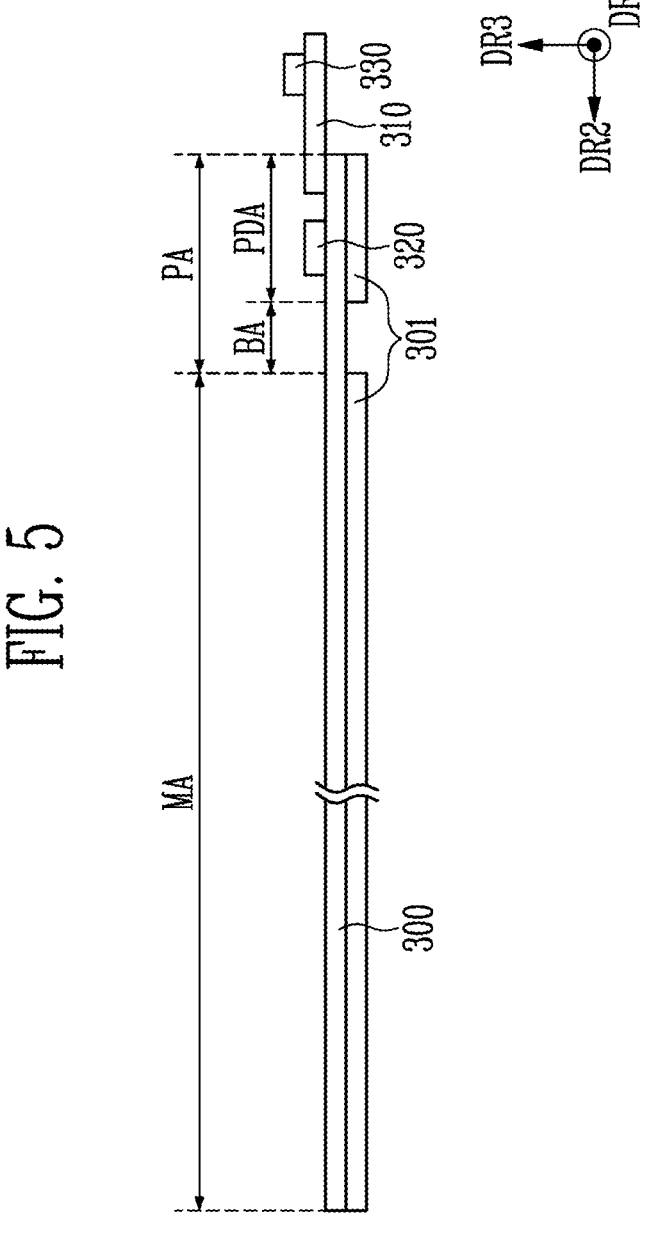
FIGS. 5 and 6 are side views of the display panel of FIG. 3.
Figure 6:
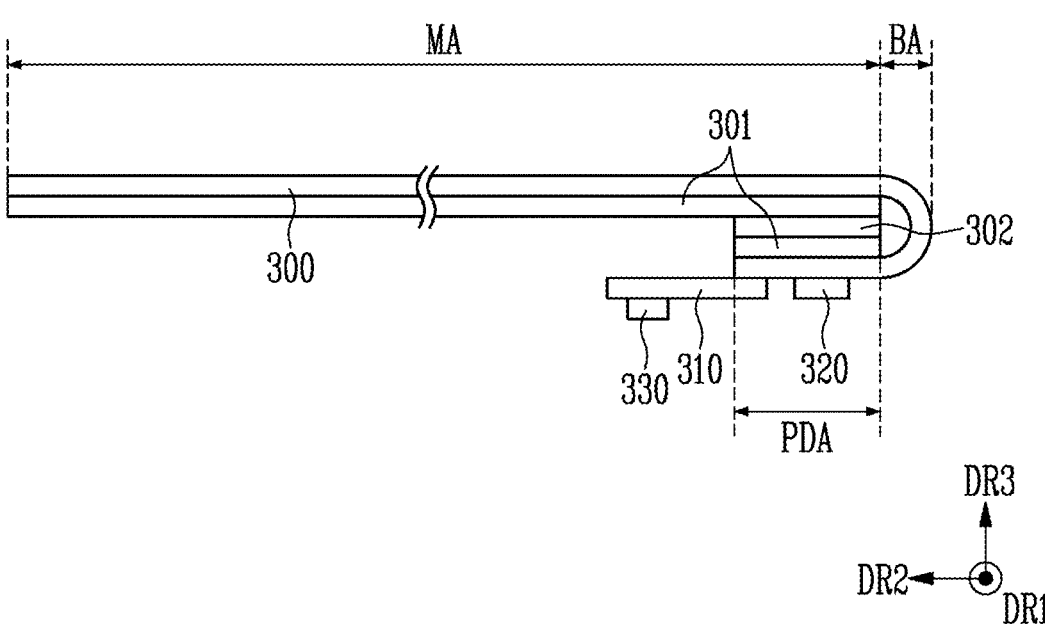

FIGS. 3 and 4 are plan views of an embodiment of the display panel. FIGS. 5 and 6 are side views of the display panel of FIG. 3.

Referring to FIGS. 3 to 6, the display panel 300 may include a main area MA and a protruding area PA protruding from one side of the main area MA.

The main area MA may have a quadrangular (e.g., rectangular shape) including a short side of the first direction DR1 and a long side of the second direction DR2 crossing the first direction DR1. A corner where the short side of the first direction DR1 and the long side of the second direction DR2 meet may be rounded to have a predetermined curvature or may have a right angle.

The main area MA may include a display area DA in which pixels display an image, and a non-display area NDA that is a peripheral area of the display area DA.

In addition to the pixels, scan lines, data lines, and power lines connected to the pixels may be disposed in the display area DA. When the main area MA includes a curved surface portion, the display area DA may be disposed in the curved surface portion. In this case, the image of the display panel 300 may also be seen in the curved surface portion.

The display area DA may include the first area A1 and the second area A2 described above. The first area A1 may be disposed on one side of the second area A2, but is not limited thereto. That is, as shown in FIG. 4, the display area DA may include a plurality of first areas A1, and the first area A1 may be surrounded by the second area A2. In addition, the first area A1 may be disposed adjacent to a corner of the second area A2.

The number of first areas A1 may be plural. In this case, the number of first areas A1 may correspond to the number of under panel sensors 720, 730, 740, and 750, and each of the under panel sensors 720, 730, 740, and 750 may overlap one first area A1.

A size of the first area A1 may be different from a size of the second area A2. In an embodiment, the size of the first area A1 may be less than the size of the second area A2, for example, but is not limited thereto.

Referring back to FIG. 3, a scan driver for applying scan signals to scan lines and link lines connecting data lines and the display driving circuit 320 may be disposed in the non-display area NDA.

The protruding area PA may protrude from one side of the main area MA. In an embodiment, the protruding area PA may protrude from a lower side of the main area MA as shown in FIG. 3, for example. A length of the protruding area PA in the first direction DR1 may be less than a length of the main area MA in the first direction DR1.

The protruding area PA may include a bending area BA and a pad area PDA. In this case, the pad area PDA may be disposed on one side of the bending area BA, and the main area MA may be disposed on another side of the bending area BA. That is, the bending area BA may be disposed between the main area MA and the pad area PDA.

The display panel 300 may be flexibly provided to be bent, curved, bent, folded, or rolled. Therefore, the display panel 300 may be bent in a thickness direction (Z-axis direction) in the bending area BA. As shown in FIG. 5, before the display panel 300 is bent, one surface of the pad area PDA of the display panel 300 may face upward. When the display panel 300 is bent as shown in FIG. 6, the one surface of the pad area PDA of the display panel 300 faces downward. Therefore, since the pad area PDA is disposed under the main area MA, the pad area PDA may overlap the main area MA.

Pads electrically connected to the display driving circuit 320 and the display circuit board 310 may be disposed in the pad area PDA of the display panel 300.

A panel protective film 301 may be disposed under the display panel 300. The panel protective film 301 may be attached to the lower surface of the display panel 300 through an adhesive member. In an embodiment, the adhesive member may be a pressure sensitive adhesive ("PSA"), for example.

The panel protective film 301 may include a light absorbing member for absorbing light incident from the outside, a buffer member for absorbing impact from the outside, a heat dissipation member for efficiently dissipating heat of the display panel 300, and the like.

The light absorbing member may be disposed under the display panel 300. The light absorbing member may prevent transmission of light to prevent configurations disposed under the light absorbing member, for example, the display circuit board 310 and the like, from being seen from above the display panel 300. The light absorbing member may include a light absorbing material such as a black pigment or a black dye.

The buffer member may be disposed under the light absorbing member. The buffer member may absorb an external impact to prevent the display panel 300 from being damaged. The buffer member may include a single layer or a plurality of layers. In an embodiment, the buffer member may include a polymer resin such as polyurethane, polycarbonate, polypropylene, or polyethylene, or may be provided by including a material having elasticity, such as a rubber, urethane-based material, or a sponge foamed from an acrylic-based material, for example. The buffer member may be a cushion layer.

The heat dissipation member may be disposed under the buffer member. The heat dissipation member may include a first heat dissipation layer including graphite, carbon nanotube, and the like, and a second heat dissipation layer including a thin metal film such as copper, nickel, ferrite, or silver that may shield an electromagnetic wave and has excellent thermal conductivity.

In order to cause the display panel 300 to be easily bent, the panel protective film 301 may not be disposed in the bending area BA of the display panel 300 as shown in FIG. 5. Since the display panel 300 is bent in the bending area BA and the pad area PDA is disposed under the main area MA, the pad area PDA may overlap the main area MA. Therefore, the panel protective film 301 disposed in the main area MA of the display panel 300 and the panel protective film 301 disposed in the pad area PDA of the display panel 300 may be bonded to each other by an adhesive member 302. In an embodiment, the adhesive member 302 may be a PSA, for example.

Although not shown in the drawing, a panel lower cover may be further disposed under the panel protective film 301. The panel lower cover may be disposed under the panel protective film 301 disposed in the main area MA, and may not be disposed in the bending area BA and the pad area PDA. In an embodiment, when the display panel 300 is bent in the bending area BA so that the pad area PDA is disposed under the main area MA, the panel lower cover may at least partially overlap the pad area PDA.

The display driving circuit 320 outputs signals and voltages for driving the display panel 300. In an embodiment, the display driving circuit 320 may supply data voltages to the data lines, for example. In addition, the display driving circuit 320 may supply a power voltage to the power line and supply scan control signals to the scan driver. The display driving circuit 320 may be provided as an IC and may be disposed (e.g., mounted) on the display panel 300 in the pad area PDA by a COG method, a COP method, or an ultrasonic bonding method, but is not limited thereto. In an embodiment, the display driving circuit 320 may be disposed (e.g., mounted) on the display circuit board 310, for example.

The pads may include display pads electrically connected to the display driving circuit 320 and sensing pads electrically connected to the sensing lines.

The display circuit board 310 may be attached on the pads using an anisotropic conductive film. Therefore, lead lines of the display circuit board 310 may be electrically connected to the pads. In an embodiment, the display circuit board 310 may be a flexible film such as an FPCB, a PCB, or a chip-on film.

The sensing driver 330 may be connected to the sensing electrodes of the sensing layer of the display panel 300. The sensing driver 330 applies driving signals to the sensing electrodes of the sensing layer and measures mutual capacitance values of the sensing electrodes. The drive signal may be a signal having a plurality of driving pulses. The sensing driver 330 may determine touch-or-not, proximity-or-not, and the like of the user according to the mutual capacitance values.

The sensing driver 330 may be disposed on the display circuit board 310. The sensing driver 330 may be provided as an IC and disposed (e.g., mounted) on the display circuit board 310.

Figure 7:
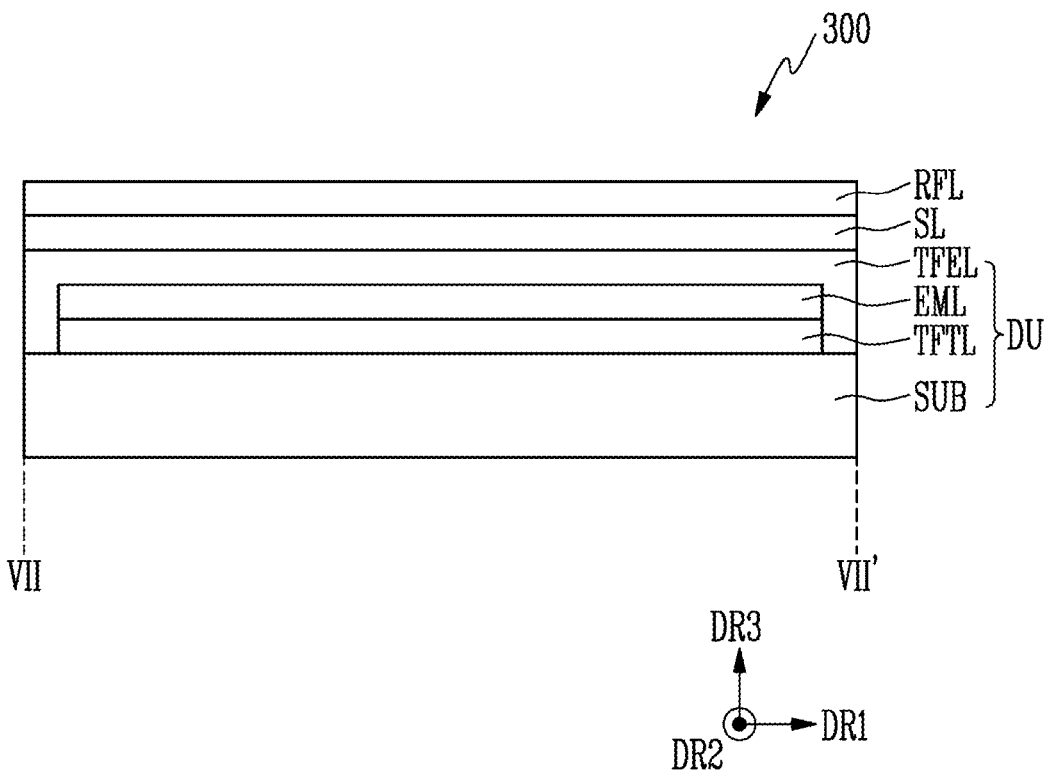
FIG. 7 is a cross-sectional view taken along line VII-VII' of FIG. 3.

FIG. 7 is a cross-sectional view taken along line VII-VII' of FIG. 3.

Referring to FIG. 7, the display panel 300 may include a display unit DU including a substrate SUB, a thin film transistor ("TFT") layer TFTL, a light emitting element layer EML, and a thin film encapsulation layer TFEL, a sensing layer SL disposed on the display unit DU, an antireflection layer RFL disposed on the sensing layer SL.

The substrate SUB may be a rigid substrate or a flexible substrate capable of bending, folding, rolling, or the like. In an embodiment, when the substrate SUB is the flexible substrate, the substrate SUB may include polyimide ("PI"), for example, but is not limited thereto.

The TFT layer TFTL may be disposed on the substrate SUB. In the TFT layer TFTL, not only TFTs of each of the pixels, but also scan lines, data lines, power lines, scan control lines, routing lines connecting the pads and the data lines, and the like may be provided. Each of the TFTs may include a gate electrode, a semiconductor layer, a source electrode, and a drain electrode.

The TFT layer TFTL may be disposed in the display area DA and the non-display area NDA. In an embodiment, the TFTs, the scan lines, the data lines, and the power lines of the TFT layer TFTL may be disposed in the display area DA, for example. In addition, the scan control lines and the link lines of the TFT layer TFTL may be disposed in the non-display area NDA.

The light emitting element layer EML is disposed on the TFT layer TFTL. The light emitting element layer EML may include pixels including a first electrode, a light emitting layer, and a second electrode, and a pixel defining layer defining a light emitting area of the pixels. The light emitting layer may be an organic light emitting layer including an organic material. In this case, the light emitting layer may include a hole transporting layer, an organic light emitting layer, and an electron transporting layer.

When a predetermined voltage is applied to the first electrode through the TFT of the TFT layer TFTL and a cathode voltage is applied to the second electrode, a hole and an electron are moved to the organic light emitting layer through the hole transporting layer and the electron transporting layer, respectively, and combined to each other in the light emitting layer to emit light. The pixels of the light emitting element layer EML may be disposed in the display area DA.

The thin film encapsulation layer TFEL may be disposed on the light emitting element layer EML. The thin film encapsulation layer TFEL may prevent oxygen or moisture from penetrating into the light emitting element layer EML. To this end, the thin film encapsulation layer TFEL may include at least one inorganic film. In an embodiment, the inorganic film may include a silicon nitride layer, a silicon oxy nitride layer, a silicon oxide layer, a titanium oxide layer, an aluminum oxide layer, or any combinations thereof but is not limited thereto.

In addition, the thin film encapsulation layer TFEL may protect the light emitting element layer EML from a foreign substance such as dust. To this end, the thin film encapsulation layer TFEL may include at least one organic film. In an embodiment, the organic film may include an acryl resin, an epoxy resin, a phenolic resin, a polyamide resin, a polyimide resin or any combinations thereof, for example, but is not limited thereto.

The thin film encapsulation layer TFEL may be disposed over the display area DA and the non-display area NDA. Specifically, the thin film encapsulation layer TFEL may cover the light emitting element layer EML and the TFT layer TFTL of the display area DA and the non-display area NDA.

The sensing layer SL may be disposed on the thin film encapsulation layer TFEL. Since the sensing layer SL is disposed directly on the thin film encapsulation layer TFEL, a thickness of the display device 10 may be reduced in comparison with a case where a separate sensing panel including the sensing layer SL is attached on the thin film encapsulation layer TFEL.

Figure 10:
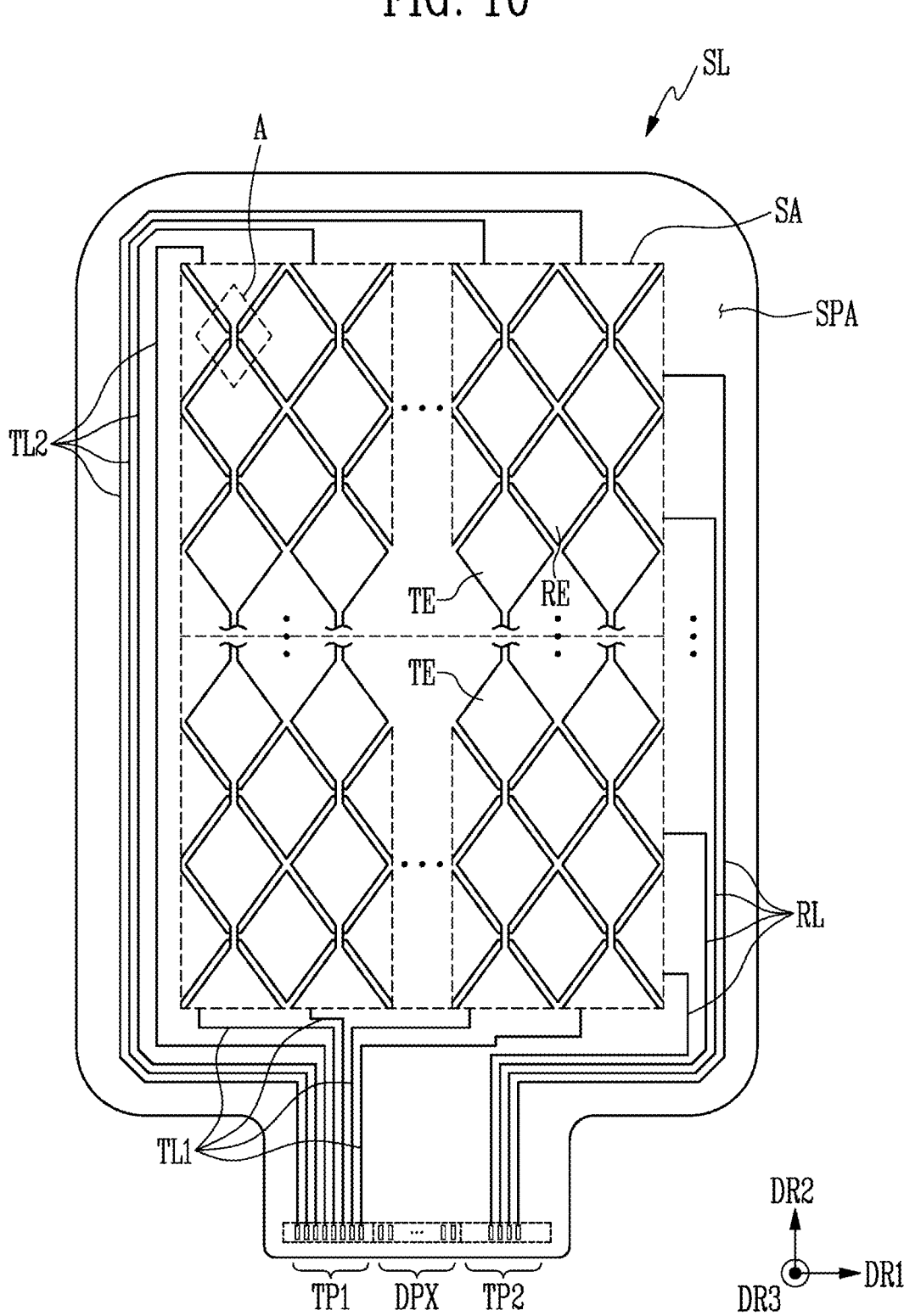
FIG. 10 is a plan view for describing a sensing layer of FIG. 7.

The sensing layer SL may include sensing electrodes that drive in a capacitive method, and sensing lines that connect the sensing pads and the sensing electrodes. The sensing electrodes of the sensing layer SL may be disposed in the sensing area SA overlapping the display area DA as shown in FIG. 10. In addition, the sensing lines of the sensing layer SL may be disposed in a sensing peripheral area SPA (refer to FIG. 10) overlapping the non-display area NDA. Detailed description of the sensing layer SL will be described later with reference to FIGS. 10 to 12.

The antireflection layer RFL may be disposed on the sensing layer SL. The antireflection layer RFL may block external light reflection. To this end, the antireflection layer RFL may include a light blocking layer including a light blocking material. Therefore, since a separate polarizing plate may be omitted, a luminance reduction of the display device 10 may be prevented and a thickness of the display panel 300 may be minimized.

Figure 8:
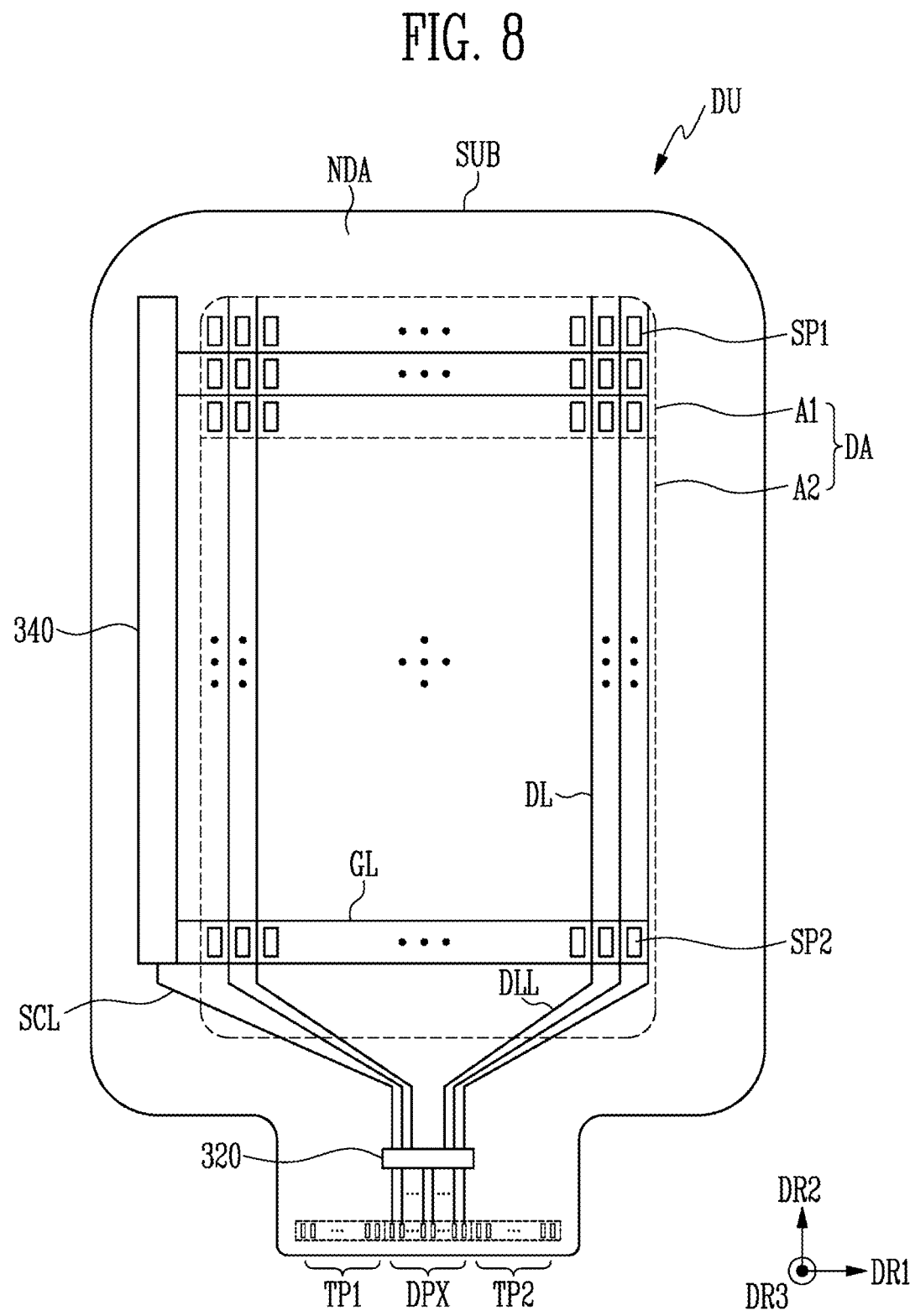
FIG. 8 is a plan view for describing a display unit of FIG. 7.
Figure 9:
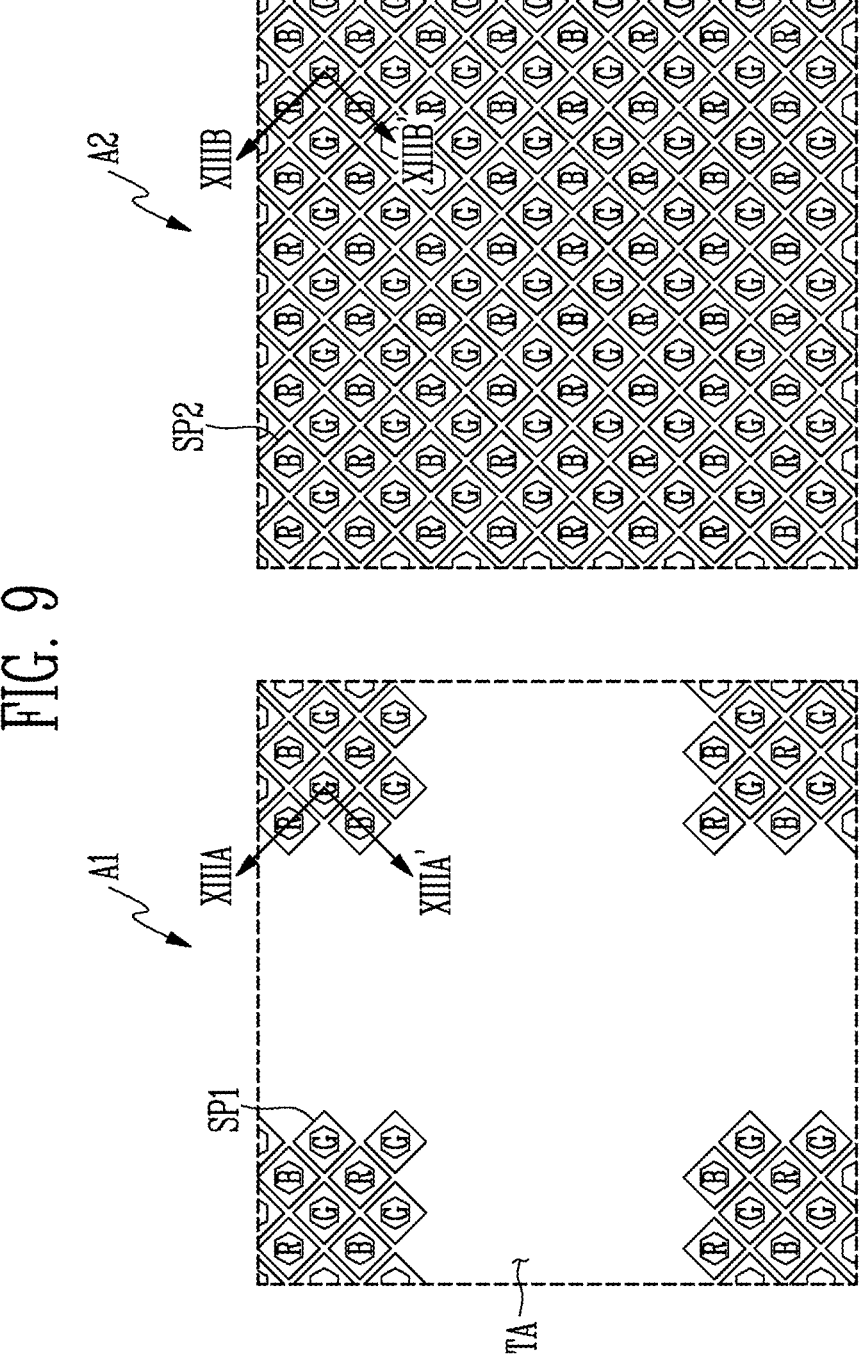
FIG. 9 is a plan view for describing a first area and a second area of FIG. 8.

FIG. 8 is a plan view for describing the display unit of FIG. 7. FIG. 9 is a plan view for describing the first area and the second area of FIG. 8.

In FIG. 8, for convenience of description, only pixels SP1 and SP2, scan lines GL, data lines DL, scan control lines SCL, fan out lines DLL, a scan driver 340, the display driving circuit 320, and display pads DPX of the display unit DU are shown.

Referring to FIG. 8, the pixels SP1 and SP2, the scan lines GL, and the data lines DL are disposed in the display area DA.

The pixels SP1 and SP2 may include first pixels SP1 disposed in the first area A1 and second pixels SP2 disposed in the second area A2. Detailed description thereof will be given with reference to FIG. 9.

Referring to FIG. 9, the first area A1 may include the first pixel SP1 and a light transmitting portion TA surrounded by the first pixels SP1. The light transmitting portion TA may be an area where the first pixel SP1 is not disposed and may not overlap the first pixels SP1.

The second area A2 may not include the light transmitting portion TA. As the light transmitting portion TA is partially provided in the first area A1, the number of first pixels SP1 per unit area of the first area A1 and the number of second pixels SP2 pixel per unit area of the second area A2 may be different. In an embodiment, the number of first pixels SP1 per unit area of the first area A1 may be less than the number of second pixels SP2 per unit area of the second area A2, for example. In addition, a size of the first pixel SP1 and a size of the second pixel SP2 may be different.

The light transmitting portion TA of the first area A1 may overlap the under panel sensors 720, 730, 740, and 750 in the thickness direction. In this case, the light transmitting portion TA may provide a path through which light from an upper portion of the display panel 300 may be incident to the under panel sensors 720, 730, 740, and 750. To this end, a portion of a layer configuring the TFT layer TFTL and the light emitting element layer EML may be omitted in the light transmitting portion TA. Therefore, even though the under panel sensors 720, 730, 740, and 750 overlap the display panel 300, a sensing capability of the under panel sensors 720, 730, 740, and 750 may be prevented or reduced as described above.

When some layers are omitted in the light transmitting portion TA of the first area A1, a step difference may occur between the first area A1 and the second area A2, and thus an optical characteristic difference such as side luminance ratio and white angular dependency ("WAD") may occur.

Here, the WAD means an issue such that a green (or another color) tone is seen at an edge according to a viewing angle of a viewer.

Therefore, the display device 10 in an embodiment may minimize the optical characteristic difference of the first area A1 and the second area A2 by differently designing gaps between the pixel defining layer and the light blocking layer in the first area A1 and the second area A2. Detailed description thereof will be described later with reference to FIG. 13.

Each of the first pixel SP1 and the second pixel SP2 may include a first sub pixel R emitting a first color, a second sub pixel G emitting a second color, and a third sub pixel B emitting a third color.

In FIG. 9, the first sub pixel R and the third sub pixel B are alternately arranged in a first column, and the second sub pixel G is arranged in a second column, but the invention is not limited thereto.

In addition, FIG. 9 illustrates a case in which the sub pixels R, G, and B have the same shape and size, but the invention is not limited thereto. In an embodiment, the sub pixels R, G, and B may have different shapes and sizes. In this case, the third sub pixel B may have the largest size, and the second sub pixel G may have the smallest size, but the invention is not limited thereto, for example.

The first area A1 and the second area A2 shown in FIG. 9 only show an example of disposition of the pixels SP1 and SP2, and the disposition of the pixels SP1 and SP2 defined in the first area A1 and the second area A2 may be variously modified.

Referring back to FIG. 8, the scan lines GL may be disposed side by side in the first direction DR1, and the data lines DL may be disposed side by side in the second direction DR2 crossing the first direction DR1.

Each of the first pixel SP1 and the second pixel SP2 may be connected to at least one of the scan lines GL and any one of the data lines DL. Each of the first pixel SP1 and the second pixel SP2 may include TFTs including a driving transistor and at least one switching transistor, a light emitting element, and a capacitor.

When a scan signal is applied from the scan line GL, each of the first pixel SP1 and the second pixel SP2 may receive a data voltage of the data line DL and may emit light by supplying a driving current to the light emitting element according to the data voltage applied to the gate electrode. The light emitting element has been described based on an organic light emitting element including a first electrode, an organic light emitting layer, and a second electrode, but is not limited thereto. That is, the light emitting element may be implanted as a quantum dot light emitting element including a first electrode, a quantum dot light emitting layer, and a second electrode, an inorganic light emitting layer including a first electrode, an inorganic semiconductor, and a second electrode, or a micro light emitting element including a micro light emitting diode.

The scan driver 340 is connected to the display driving circuit 320 through the scan control lines SCL. Therefore, the scan driver 340 may receive the scan control signal of the display driving circuit 320. The scan driver 340 generates scan signals according to the scan control signal and supplies the scan signals to the scan lines GL.

In FIG. 8, the scan driver 340 is disposed in the non-display area NDA on the left outer side of the display area DA. However, the invention is not limited thereto. In an embodiment, the scan driver 340 may be disposed in the non-display area NDA on a left outer side and a right outer side of the display area DA, for example.

The display driving circuit 320 is connected to the display pads DPX to receive digital video data and timing signals. The display driving circuit 320 converts the digital video data into analog positive/negative data voltages and supplies the analog positive/negative data voltages to the data lines DL through the fan out lines DLL. In addition, the display driving circuit 320 generates and supplies the scan control signal for controlling the scan driver 340 through the plurality of scan control lines SCL. The pixels SP1 and SP2 to which the data voltages are to be supplied are selected by the scan signals of the scan driver 340, and the data voltages are supplied to the selected pixels SP1 and SP2.

Figure 11:
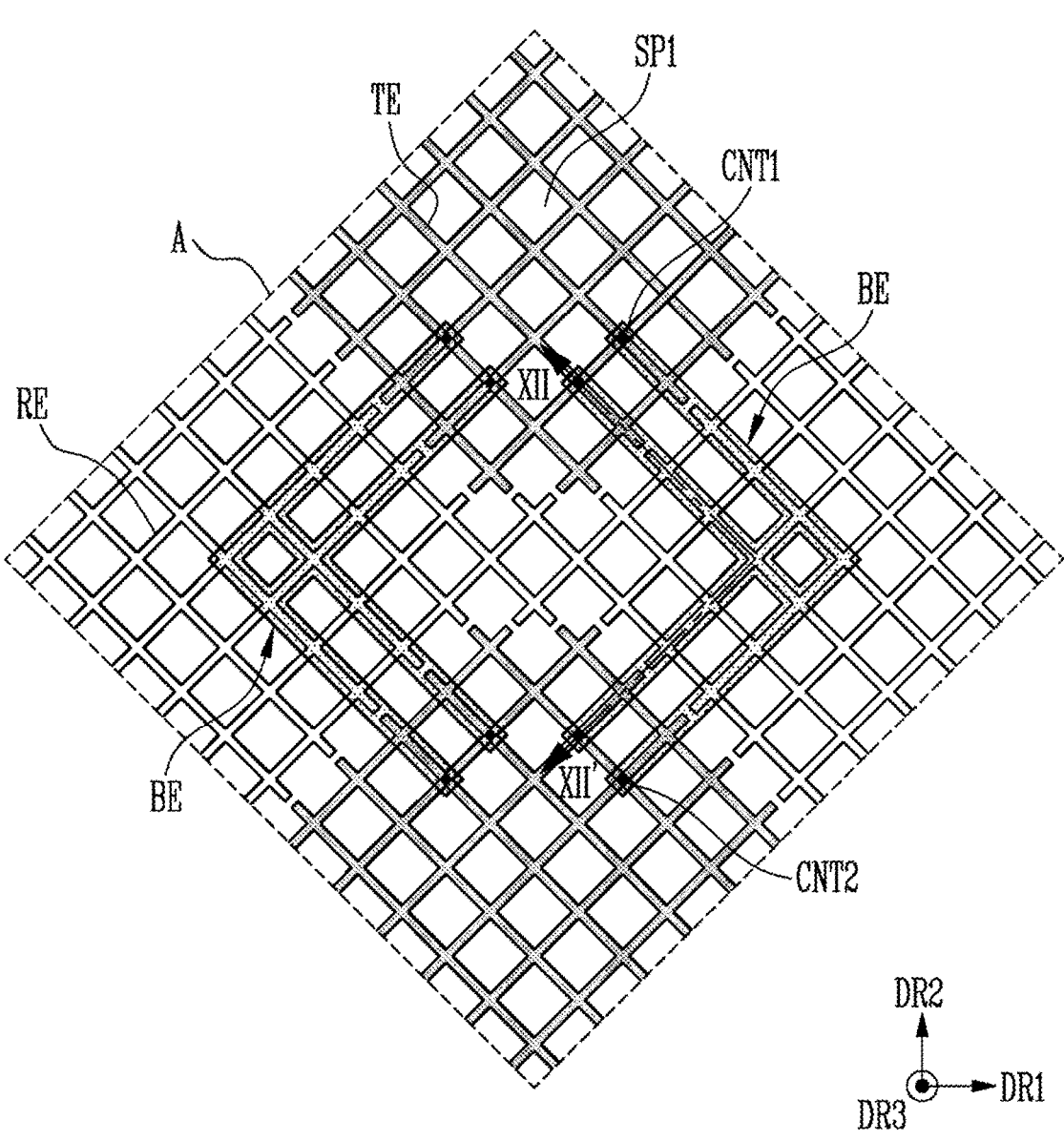
FIG. 11 is an enlarged view of a region A of FIG. 10.
Figure 12:
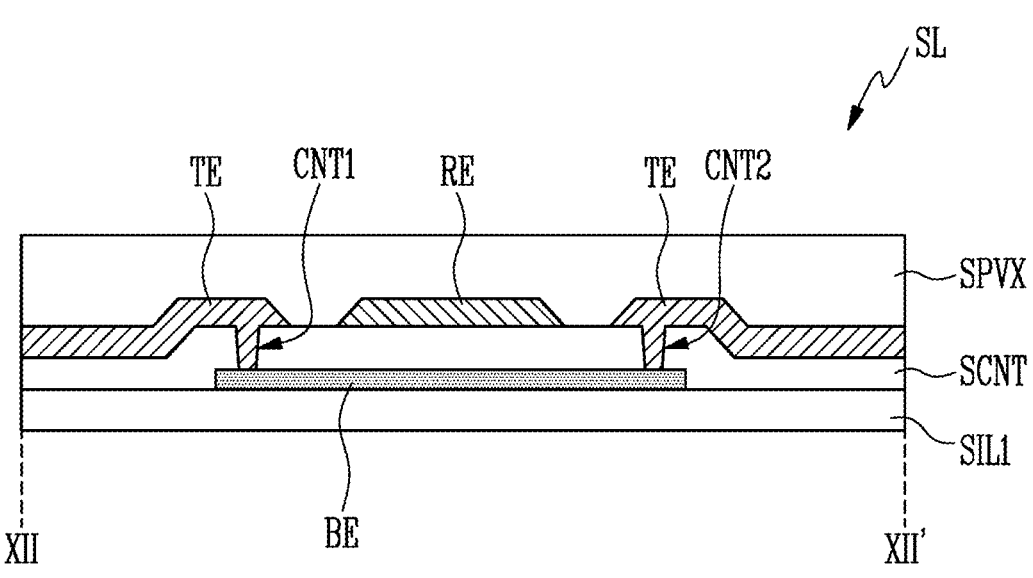
FIG. 12 is a cross-sectional view taken along line XII-XII' of FIG. 11.

FIG. 10 is a plan view for describing the sensing layer of FIG. 7. FIG. 11 is an enlarged view of a region A of FIG. 10. FIG. 12 is a cross-sectional view taken along line XII-XII' of FIG. 11.

Referring to FIGS. 10 to 12, the sensing layer SL includes the sensing area SA for sensing a touch of the user and the sensing peripheral area SPA disposed around the sensing area SA.

In FIG. 10, the sensing electrodes TE and RE of the sensing layer SL include first sensing electrodes TE and second sensing electrodes RE, and are driven by a mutual capacitance method of two layers, which is driven by a mutual capacitance method in which a driving signal is applied to the first sensing electrodes TE and then sensing change amounts of mutual capacitances through the second sensing electrodes RE. However, the invention is not limited thereto. In an embodiment, the sensing layer SL may include the first sensing electrodes TE and the second sensing electrodes RE without a connection electrodes BE, and may be driven by a mutual capacitance method of one layer, which is driven by a mutual capacitance method, for example. In an alternative embodiment, the sensing layer SL may be driven by a self-capacitance method of one layer that senses a change amount of the self-capacitances using one kind of sensing electrodes.

Referring to FIG. 10, the sensing layer SL includes the sensing area SA for sensing the touch of the user and the sensing peripheral area SPA disposed around the sensing area SA. The sensing area SA may overlap the display area DA of the display unit DU, and the sensing peripheral area SPA may overlap the non-display area NDA of the display unit DU.

The first sensing electrodes TE may be disposed along the second direction DR2 and may electrically connected to each other. The second sensing electrodes RE may be disposed along the first direction DR1 crossing the second direction DR2 and may be electrically connected to each other. The first sensing electrodes TE and the second sensing electrodes RE may be electrically separated from each other. The first sensing electrodes TE and the second sensing electrodes RE may be spaced apart from each other.

Referring to FIG. 11, the first sensing electrodes TE adjacent in the second direction DR2 may be electrically connected to each other by the connection electrodes BE, and the first sensing electrodes TE adjacent in the first direction DR1 may be insulated from each other. In addition, the second sensing electrodes RE adjacent in the first direction DR1 may be electrically connected to each other, and the second sensing electrodes RE adjacent in the second direction DR2 may be electrically insulated from each other. Therefore, a mutual capacitance may be generated at intersections of the first sensing electrodes TE and the second sensing electrodes RE. The sensing driver 330 may determine touch-or-not of the user by sensing a voltage charged in the mutual capacitance.

The connection electrodes BE may be connected to the first sensing electrodes TE adjacent to each other in the second direction DR2 through a first contact hole CNT1 and a second contact hole CNT2, respectively. One end of the connection electrode BE may be connected to the first sensing electrode TE of one of the first sensing electrodes TE adjacent in the second direction DR2 through the first contact hole CNT1. Another end of the connection electrode BE may be connected to another first sensing electrode TE among the first sensing electrodes TE adjacent in the second direction DR2 through the second contact hole CNT2. FIG. 11 illustrates a structure in which the first sensing electrodes TE are connected by a pair of connection electrodes BE, but the invention is not limited thereto. In an embodiment, the connection electrode BE may include a plurality of pairs of sub connection electrodes, for example.

The first sensing electrode TE and the second sensing electrode RE may be disposed in a mesh shape or a network shape. When the sensing layer SL including the first sensing electrode TE and the second sensing electrodes RE is directly disposed on the thin film encapsulation layer TFEL as shown in FIG. 7, a distance between the second electrode of the light emitting element layer EML and each of the first sensing electrode TE and the second sensing electrode RE of the sensing layer SL is reduced, and thus a parasitic capacitance may be largely generated between the second electrode of the light emitting element layer EML and the first sensing electrode TE and the second sensing electrode RE. Since the parasitic capacitance is proportional to the overlapping area between the second electrode of the light emitting element layer EML and the first sensing electrode TE and the second sensing electrode RE of the sensing layer SL, in order to reduce the parasitic capacitance, it is preferable that the first sensing electrode TE and the second sensing electrode RE have the mesh shape or the network shape.

In addition, when the first sensing electrode TE and the second sensing electrode RE have the mesh shape or the network shape, reduction of a luminance of light, which is caused by block of the light output from the pixels SP1 and SP2 by the first sensing electrode TE and the second sensing electrode RE, may be prevented. To this end, a mesh structure of the first sensing electrode TE and the second sensing electrode RE may overlap the pixel defining layer defining the light emitting area of the pixels SP1 and SP2.

Referring back to FIG. 10, sensing pads TP1 and TP2 and sensing lines TL1, TL2, and RL may be disposed in the sensing peripheral area SPA.

The sensing pads TP1 and TP2 may be disposed on one side of the display device 10. The sensing pads TP1 and TP2 may include a first sensing pad TP1 and a second sensing pad TP2. The first sensing pad TP1 may be disposed on one side of the display pad DPX, and the second sensing pad TP2 may be disposed on another side of the display pad DPX, but the invention is not limited thereto.

The sensing lines TL1, TL2, and RL may include drive lines TL1 and TL2 connected to the first sensing electrode TE, and a sensing line RL connected to the second sensing electrode RE.

The drive lines TL1 and TL2 may include a first drive line TL1 connected to the first sensing electrodes TE disposed on one side of the sensing area SA, and a second drive line TL2 connected to the first sensing electrodes TE disposed on another side of the sensing area SA. Here, the one side of the sensing area SA may mean a lower side of the sensing area SA, and the other side of the sensing area SA may mean an upper side of the sensing area SA. The upper side and the lower side of the sensing area SA may be opposite to each other. In an embodiment, as shown in FIG. 10, the first sensing electrode TE disposed at a lower side end of the first sensing electrodes TE electrically connected in the second direction DR2 may be connected to the first drive line TL1, and the first sensing electrode TE disposed at an upper side end of the first sensing electrodes TE electrically connected in the second direction DR2 may be connected to the second drive line TL2, for example.

The second drive lines TL2 may be connected to the first sensing electrodes TE on the upper side of the sensing area SA via the left outer side of the sensing area SA. One end of the drive lines TL1 and TL2 may be connected to the first sensing electrodes TE, and another end of the drive lines TL1 and TL2 may be connected to the first sensing pads TP1. Therefore, the sensing driver 330 may be electrically connected to the first sensing electrodes TE.

The second sensing electrodes RE disposed on one side of the sensing area SA may be connected to the sensing lines RL. In an embodiment, as shown in FIG. 10, the second sensing electrode RE disposed at the right end of the second sensing electrodes RE electrically connected in the first direction DR1 may be connected to the sensing line RL, for example. One end of the sensing lines RL may be connected to the second sensing electrode RE, and another end of the sensing line RL may be connected to the second sensing pads TP2. Therefore, the sensing driver 330 may be electrically connected to the second sensing electrodes RE.

Although not shown in the drawing, a ground line may be further disposed outside the sensing lines TL1, TL2, and RL.

The ground line may be disposed at the outermost portion of the sensing layer SL. A ground voltage may be applied to the ground line. Therefore, when a static electricity is applied from the outside, the static electricity may be discharged to the ground line. One end of the ground line may be electrically connected to the sensing pads TP1 and TP2.

In addition, a guard line may be further disposed between the sensing lines TL1, TL2, and RL and the ground line. Therefore, the guard line may minimize coupling between the sensing lines TL1, TL2, and RL or minimize coupling between the sensing lines TL1, TL2, and RL and the ground line. One end of the guard line may be electrically connected to the sensing pads TP1 and TP2.

Referring to FIG. 12, the sensing layer SL includes a first sensing insulating layer SIL1, a sensing contact layer SCNT, a sensing protective layer SPVX, a first sensing conductive layer, and a second sensing conductive layer. Each of the above-described layers may include a single film, but may also include a stack film including a plurality of films. Another layer may be further disposed between each of layers.

The first sensing insulating layer SIL1 may include an inorganic film. However, the invention is not limited thereto, and the first sensing insulating layer SIL1 may include an organic film, or may have a structure in which an inorganic film and an organic film are alternately stacked.

In an embodiment, the inorganic film may include, for example, at least one of aluminum oxide, titanium oxide, silicon oxide, silicon oxynitride, zirconium oxide, and hafnium oxide.

In an embodiment, the organic film may include, for example, at least one of acrylic resin, methacrylic resin, polyisoprene, vinyl resin, epoxy resin, urethane resin, cellulose resin, siloxane resin, polyimide resin, polyamide resin, and perylene resin.

The first sensing conductive layer may be disposed on the first sensing insulating layer SIL1. In an embodiment, the first sensing conductive layer may include molybdenum, titanium, copper, aluminum, or an alloy thereof, for example.

The first sensing conductive layer may include the connection electrode BE described above. As described above, the first sensing conductive layer forming the connection electrode BE may have the mesh shape. In this case, the first sensing conductive layer may not be seen to the user. In addition, the connection electrode BE may overlap the pixel defining layer, which will be described later, in order to prevent an aperture ratio of the pixel from being lowered.

The sensing contact layer SCNT may be disposed on the first sensing conductive layer. The sensing contact layer SCNT insulates the first sensing conductive layer from the second sensing conductive layer.

The sensing contact layer SCNT may include the same material as that of the above-described first sensing insulating layer SIL1 or may include one or more materials including at least one of materials exemplified as configuration materials of the first sensing insulating layer SIL1. In an embodiment, the sensing contact layer SCNT may include an inorganic film, for example, but is not limited thereto.

The second sensing conductive layer may be disposed on the sensing contact layer SCNT. The second sensing conductive layer may include the same material as that of the above-described first sensing conductive layer, or may include one or more materials including at least one of materials exemplified as configuration materials of the first sensing conductive layer.

The second sensing conductive layer may include the first sensing electrodes TE and the second sensing electrodes RE described above. The first sensing electrode TE may be electrically connected to the connection electrode BE through the contact holes CNT1 and CNT2 passing through the sensing contact layer SCNT to expose one end of the connection electrode BE.

As described above, the second sensing conductive layer forming the first sensing electrodes TE and the second sensing electrodes RE may have the mesh shape. In this case, the second sensing conductive layer may not be seen to the user. In addition, the first sensing electrodes TE and the second sensing electrodes RE may overlap the pixel defining layer, which will be described later, in order to prevent the aperture ratio of the pixel from being lowered.

The sensing protective layer SPVX may be disposed on the second sensing conductive layer. The sensing protective layer SPVX may include an organic film. However, the invention is not limited thereto, and the sensing protective layer SPVX may include an inorganic film, or may have a structure in which an organic film and an inorganic film are alternately stacked.

In an embodiment, the organic film may include, for example, at least one of acrylic resin, methacrylic resin, polyisoprene, vinyl resin, epoxy resin, urethane resin, cellulose resin, siloxane resin, polyimide resin, polyamide resin, and perylene resin.

In an embodiment, the inorganic film may include, for example, at least one of aluminum oxide, titanium oxide, silicon oxide, silicon oxynitride, zirconium oxide, and hafnium oxide.

Hereinafter, a cross-sectional structure of the first area A1 and the second area A2 will be described in detail.

Figure 13:
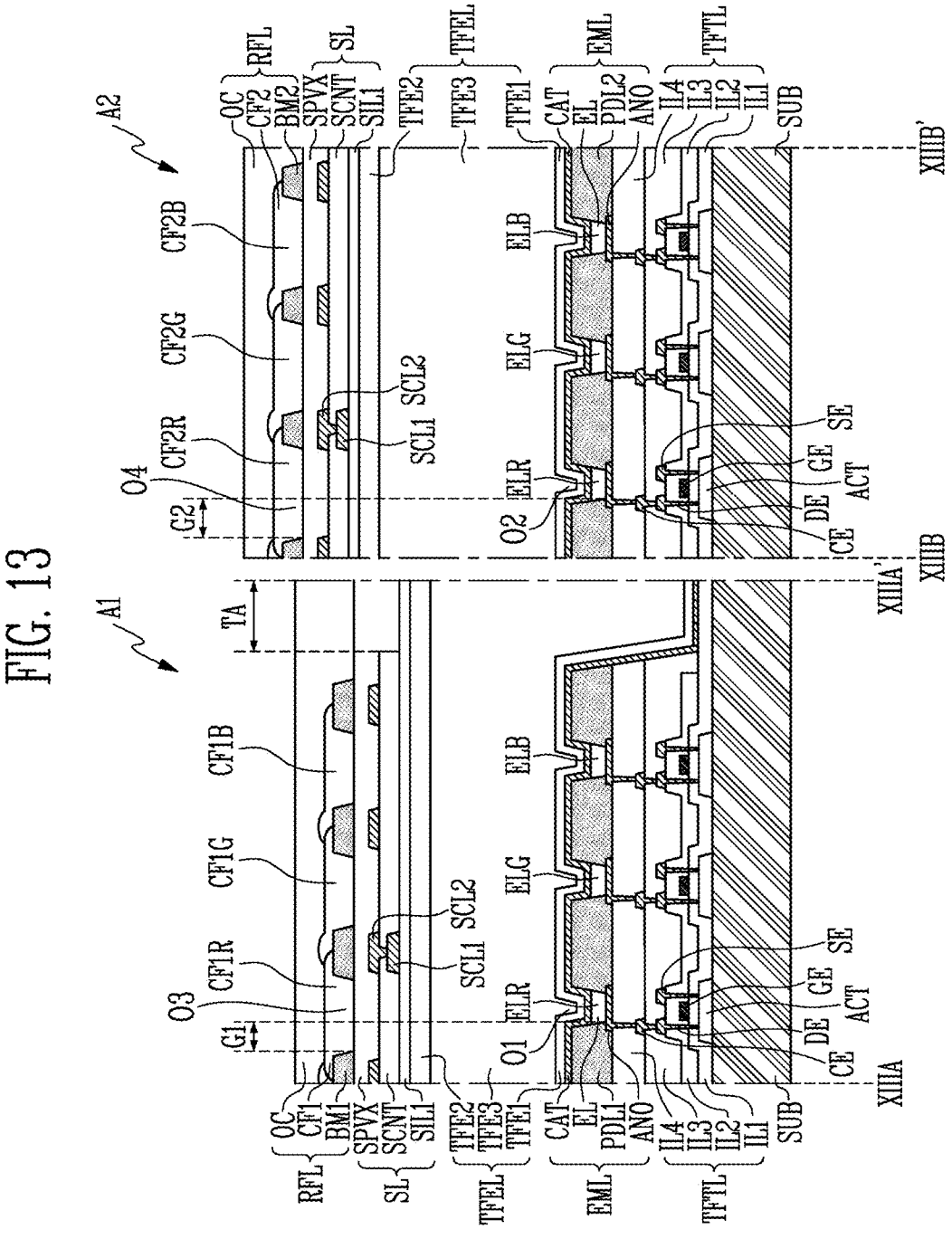
FIG. 13 is a cross-sectional view taken along line XIIIA-XIIIA' and a line XIIIB-XIIIB' of FIG. 9.

FIG. 13 is a cross-sectional view taken along line XIIIA-XIIIA' and a line XIIIB-XIIIB' of FIG. 9.

Referring to FIG. 13, the TFT layer TFTL may be disposed on the substrate SUB. The TFT layer TFTL may include a semiconductor layer ACT, a first insulating layer IL1, a first conductive layer, a second insulating layer IL2, a second conductive layer, a third insulating layer IL3, a third conductive layer, and a fourth insulating layer IL4.

Each of the above-described layers may include a single film, but may also include a stack film including a plurality of films. Another layer may be further disposed between each of layers.

The semiconductor layer ACT may be disposed on the substrate SUB. A buffer layer may be further disposed between the semiconductor layer ACT and the substrate SUB. The buffer layer may prevent diffusion of an impurity ion, prevent penetration of moisture, and perform a surface planarization function. In an embodiment, the buffer layer may include silicon nitride, silicon oxide, or silicon oxynitride, for example, but is not limited thereto.

The semiconductor layer ACT forms a channel of the TFTs of the first pixel SP1 and the second pixel SP2. In an embodiment, the semiconductor layer ACT may include polycrystalline silicon, for example. In an embodiment, the polycrystalline silicon may be provided by crystallizing amorphous silicon, for example.

When the semiconductor layer ACT includes the polycrystalline silicon, an ion-doped semiconductor layer ACT may have conductivity. Therefore, the semiconductor layer ACT may include a source region and a drain region as well as a channel region of the TFTs. The source region and the drain region may be connected to both sides of each channel region.

In another embodiment, the semiconductor layer ACT may include monocrystalline silicon, low temperature polycrystalline silicon, amorphous silicon, or an oxide semiconductor. The oxide semiconductor may include, for example, a binary compound (ABx), a ternary compound (ABxCy), or a quaternary compound (ABxCyDz) including indium, zinc, gallium, tin, titanium, aluminum, hafnium (Hf), zirconium (Zr), magnesium (Mg), and the like. In addition, the semiconductor layer ACT may include indium-tin-zinc oxide ("ITZO") or indium-gallium-zinc oxide ("IGZO").

The first insulating layer IL1 is disposed on the semiconductor layer ACT. The first insulating layer IL1 may be disposed on the entire surface of the substrate SUB. That is, the first insulating layer IL1 may be disposed in the entire first area A1 and second area A2.

The first insulating layer IL1 may be a gate insulating film having a gate insulating function. The first insulating layer IL1 may include a silicon compound or a metal oxide. In an embodiment, the first insulating layer IL1 may include silicon oxide, silicon nitride, silicon oxynitride, aluminum oxide, tantalum oxide, hafnium oxide, zirconium oxide, titanium oxide, or any combinations thereof or the like, for example. The first insulating layer IL1 may be a single film or a multilayer film including a stack film of different materials.

The first conductive layer is disposed on the first insulating layer IL1. In an embodiment, the first conductive layer may include one or more metals including at least one of molybdenum (Mo), aluminum (Al), platinum (Pt), palladium (Pd), silver (Ag), magnesium (Mg), gold (Au), nickel (Ni), neodium (Nd), iridium (Ir), chromium (Cr), calcium (Ca), titanium (Ti), tantalum (Ta), tungsten (W), and copper (Cu), for example. The first conductive layer may be a single layer or a multilayer film. The first conductive layer may include a gate electrode GE of the TFTs of the first pixel SP1 and the second pixel SP2, and a first electrode of a storage capacitor.

The second insulating layer IL2 is disposed on the first conductive layer. The second insulating layer IL2 may cover the gate electrode GE of the first pixel SP1 and the second pixel SP2. The second insulating layer IL2 may not be disposed in the light transmitting portion TA in order to prevent a reduction of transmittance of the light transmitting portion TA of the first area A1.

The second insulating layer IL2 may insulate the first conductive layer from the second conductive layer. The second insulating layer IL2 may include the same material as that of the above-described first insulating layer IL1 or may include one or more materials including at least one of materials exemplified as configuration materials of the first insulating layer IL1.

The second conductive layer is disposed on the second insulating layer IL2. In an embodiment, the second conductive layer may include one or more metals including at least one of aluminum (Al), molybdenum (Mo), platinum (Pt), palladium (Pd), silver (Ag), magnesium (Mg), gold (Au), nickel (Ni), neodium (Nd), iridium (Ir), chromium (Cr), calcium (Ca), titanium (Ti), tantalum (Ta), tungsten (W), and copper (Cu), for example. The second conductive layer may be a single film or a multilayer film. In an embodiment, the second conductive layer may include a stack structure such as Ti/Al/Ti, Mo/Al/Mo, Mo/AlGe/Mo, or Ti/Cu, for example.

The second conductive layer may include a source electrode SE and a drain electrode DE of the TFTs of the first pixel SP1 and the second pixel SP2. The source electrode SE and the drain electrode DE may be connected to the source region and the drain region of the semiconductor layer ACT through contact holes passing through the second insulating layer IL2 and the first insulating layer IL1, respectively.

The third insulating layer IL3 covers the second conductive layer. The third insulating layer IL3 may cover the source electrode SE and the drain electrode DE of the first pixel SP1 and the second pixel SP2. The third insulating layer IL3 may not be disposed in the light transmitting portion TA in order to prevent a reduction of the transmittance of the light transmitting portion TA of the first area A1.

The third insulating layer IL3 may be a via layer. In an embodiment, the third insulating layer IL3 may include an organic insulating material such as an acrylic resin (poly-acrylates resin), an epoxy resin, a phenolic resin, a poly-amides resin, a polyimide resin, an unsaturated poly-esters resin, poly phenylenethers resin, polyphenylenesulfides resin, benzocyclobutene ("BCB") or any combinations thereof.

The third conductive layer is disposed on the third insulating layer IL3. The third conductive layer may include the same material as that of the above-described second conductive layer, or may include one or more materials including at least one of materials exemplified as configuration materials of the second conductive layer.

The third conductive layer may include a connection electrode CE of the TFTs of the first pixel SP1 and the second pixel SP2. The connection electrode CE may be in contact with the drain electrode DE through a contact hole passing through the third insulating layer IL3.

The fourth insulating layer IL4 covers the third conductive layer. The fourth insulating layer IL4 may cover the connection electrode CE of the first pixel SP1 and the second pixel SP2. The fourth insulating layer IL4 may not be disposed in the light transmitting portion TA in order to prevent a reduction of the transmittance of the light transmitting portion TA of the first area A1.

In an embodiment, the third conductive layer and/or the fourth insulating layer IL4 may be omitted. In this case, the third insulating layer IL3 may be a via layer. That is, a first electrode ANO, which will be described later, may be in contact with the drain electrode DE through a contact hole passing through the third insulating layer IL3.

The fourth insulating layer IL4 may be a via layer. The fourth insulating layer IL4 may include the same material as that of the above-described third insulating layer IL3, or may include one or more materials including at least one of materials exemplified as configuration materials of the third insulating layer IL3.

The light emitting element layer EML may be disposed on the TFT layer TFTL. The light emitting element layer EML may include a first electrode ANO, a light emitting layer EL, a second electrode CAT, and pixel defining layers PDL1 and PDL2.

The light emitting element layer EML may be disposed over the first pixel SP1 and the second pixel SP2, and may not be disposed in the light transmitting portion TA. Therefore, the light transmitting portion TA may provide a path through which light from an upper portion of the display panel 300 may be incident to the under panel sensors 720, 730, 740, and 750. In the drawing, the first electrode ANO, the light emitting layer EL, and/or the pixel defining layers PDL1 and PDL2 of the light emitting element layer EML are omitted and the second electrode CAT is disposed in the light transmitting portion TA. However, the invention is not necessarily limited thereto. In an embodiment, the first electrode ANO, the second electrode CAT, and/or the pixel defining layers PDL1 and PDL2 may be omitted and the light emitting layer EL may be disposed in the light trans-mitting portion TA.

The first electrode ANO is disposed on the fourth insulating layer IL4. The first electrode ANO may be electrically connected to the TFT of the first pixel SP1 and the second pixel SP2. Specifically, the first electrode ANO may be in contact with the connection electrode CE through a contact hole passing through the fourth insulating layer IL4 and may be electrically connected to the drain electrode DE of the TFT through the connection electrode CE. An anode elec-trode of the first pixel SP1 and the second pixel SP2 may include the first electrode ANO.

In an upper light emitting structure which emits light toward the second electrode CAT based on the light emitting layer EL, the first electrode ANO may include a metal material having high reflectance, such as a stack structure of aluminum and titanium (Ti/Al/Ti), a stack structure of aluminum and indium-tin oxide ("ITO") (ITO/Al/ITO), an APC alloy, or a stack structure of an APC alloy and ITO ("ITO/APC/ITO"). The APC alloy is an alloy of silver (Ag), palladium (Pd), and copper (Cu).

In a lower light emitting structure that emits light toward the first electrode ANO based on the light emitting layer EL, the first electrode ANO may include a transparent metal material ("TCO") such as ITO or indium-zinc oxide ("IZO") which may transmit light, or a translucent metal material such as magnesium (Mg), silver (Ag), or an alloy of mag-nesium (Mg) and silver (Ag). When the first electrode ANO includes the translucent metal material, light emission effi-ciency may be increased by a micro cavity.

The pixel defining layers PDL1 and PDL2 may partition the first electrode ANO on the fourth insulating layer IL, in order to define light emitting areas of the pixels SP1 and SP2. The pixel defining layers PDL1 and PDL2 may cover an edge of the first electrode ANO.

In an embodiment, the pixel defining layers PDL1 and PDL2 may include an organic film including at least one of an acrylic resin, an epoxy resin, a phenolic resin, a polyamide resin, and a polyimide resin, for example.

In addition, the pixel defining layers PDL1 and PDL2 may include a light absorbing material or may be coated with a light absorbing agent to absorb light introduced from the outside. In an embodiment, the pixel defining layers PDL1 and PDL2 may include a carbon-based black pigment, for example. However, the invention is not limited thereto, and the pixel defining layers PDL1 and PDL2 may also include an opaque metal material such as chromium (Cr), molybdenum (Mo), an alloy of molybdenum and titanium (MoTi), tungsten (W), vanadium (V), niobium (Nb), tantalum (Ta), manganese (Mn), cobalt (Co), nickel (Ni) or any combinations thereof having high light absorption.

The pixel defining layers PDL1 and PDL2 may include a first pixel defining layer PDL1 that defines the light emitting area of the first pixel SP1 and a second pixel defining layer PDL2 that defines the light emitting area of the second pixel SP2.

A thickness of the first pixel defining layer PDL1 may be substantially the same as a thickness of the second pixel defining layer PDL2.

In addition, a width of the first pixel defining layer PDL1 in one direction may be substantially the same as a width of the second pixel defining layer PDL2 in the one direction. At this time, the width of the pixel defining layer PDL1 (or PDL2) in the one direction may mean a distance between ends of the pixel defining layer PDL1 (or PDL2) where the ends are respectively adjacent to the light emitting layers EL.

The light emitting layer EL is disposed on the first electrode ANO and the pixel defining layers PDL1 and PDL2.

The light emitting layer EL may include an organic material and emit a predetermined color. In an embodiment, the light emitting layer EL may include a hole transporting layer, an organic material layer, and an electron transporting layer, for example. In an embodiment, a light emitting layer ELR of first sub pixels R of the first area A1 and the second area A2 may emit red light, a light emitting layer ELG of second sub pixels G may emit green light, and a light emitting layer ELB of third sub pixels B may emit blue light, for example.

In an alternative embodiment, the light emitting layer EL of the first area A1 and the second area A2 may include one or a plurality of layers to emit white light, ultraviolet light, or blue light. In this case, the first sub pixel R may overlap a red color filter that transmits the red light, the second sub pixel G may overlap a green color filter that transmits the green light, and the third sub pixel B may overlap a blue color filter that transmits the blue light.

In an alternative embodiment, the first sub pixel R may overlap a red wavelength conversion layer that converts the ultraviolet light or blue light into red light, the second sub pixel G may overlap a green wavelength conversion layer that converts the ultraviolet light or blue light into green light, and the third sub pixel B may overlap a blue wavelength conversion layer that converts the ultraviolet light or blue light into blue light.

The second electrode CAT is disposed on the light emitting layer EL and the pixel defining layers PDL1 and PDL2. When a separate spacer is further disposed on the pixel defining layers PDL1 and PDL2, the second electrode CAT may be disposed on the spacer.

The second electrode CAT may cover the light emitting layer EL of the pixels SP1 and SP2. The second electrode CAT may be a common layer commonly provided in the pixels SP1 and SP2. A capping layer may be further disposed on the second electrode CAT.

In the upper light emitting structure, the second electrode CAT may include a TCO such as ITO or IZO which may transmit light, or a translucent metal material such as magnesium (Mg), silver (Ag), or an alloy of magnesium (Mg) and silver (Ag). When the second electrode CAT includes the translucent metal material, light emission efficiency may be increased by a micro cavity.

In the lower light emitting structure, the second electrode CAT may include a metal material having high reflectance, such as a stack structure of aluminum and titanium (Ti/Al/Ti), a stack structure of aluminum and ITO (ITO/Al/ITO), an APC alloy, or a stack structure of an ITO/APC/ITO.

The thin film encapsulation layer TFEL is disposed on the light emitting element layer EML.

The thin film encapsulation layer TFEL may be disposed on the entire surface of the substrate SUB. That is, the thin film encapsulation layer TFEL may be disposed in the entire first area A1 and second area A2.

A minimum thickness of the thin film encapsulation layer TFEL of the first area A1 may be different from a minimum thickness of the thin film encapsulation layer TFEL of the second area A2. Here, the minimum thickness of the thin film encapsulation layer TFEL of each of the areas A1 and A2 may be defined as a minimum value of a length from one surface of the thin film encapsulation layer TFEL to another surface of the thin film encapsulation layer TFEL in the third direction DR3.

As described above, when a portion of the TFT layer TFTL is omitted in the light transmitting portion TA, a step difference may be provided between the light transmitting portion TA and the first pixel SP1, and thus a thin film encapsulation material layer coated on the first area A1 may flow into the light transmitting portion TA. Therefore, the minimum thickness of the thin film encapsulation layer TFEL of the first area A1 may be relatively less than the minimum thickness of the thin film encapsulation layer TFEL of the second area A2.

The thin film encapsulation layer TFEL may include a first encapsulation layer TFE1, a second encapsulation layer TFE2, and a third encapsulation layer TFE3 disposed between the first encapsulation layer TFE and the second encapsulation layer TFE2. Each of the above-described layers may include a single film, but may also include a stack film including a plurality of films. Another layer may be further disposed between each of layers.

The first encapsulation layer TFE1 may be disposed on the second electrode CAT. The first encapsulation layer TFE1 may be disposed on the entire surface of the substrate SUB. The first encapsulation layer TFE1 may be an inorganic film. In an embodiment, the inorganic film may include silicon oxide (SiOx), silicon nitride (SiNx), silicon oxynitride (SiONx) or any combinations thereof, for example, but is not limited thereto.

The second encapsulation layer TFE2 may be disposed on the first encapsulation layer TFE1. The second encapsulation layer TFE2 may be disposed on the entire surface of the substrate SUB. The second encapsulation layer TFE2 may be an inorganic film. The second encapsulation layer TFE2 may include the same material as that of the first encapsulation layer TFE1 or may include at least one material including at least one of materials exemplified as configuration materials of the first encapsulation layer TFE1.

The third encapsulation layer TFE3 may be disposed between the first encapsulation layer TFEL and the second encapsulation layer TFE2. The third encapsulation layer TFE3 may planarize a step difference due to the TFT layer TFTL and the light emitting element layer EML.

The third encapsulation layer TFE3 may be an organic film. In an embodiment, the organic film may include at least one of an acrylic resin, an epoxy resin, a phenolic resin, a polyamide resin, and a polyimide resin, for example, but is not limited thereto.

A thickness of the third encapsulation layer TFE3 may be greater than a thickness of the first encapsulation layer TFEL and/or the second encapsulation layer TFE2.

In addition, a minimum thickness of the third encapsulation layer TFE3 of the first area A1 may be different from the minimum thickness of the third encapsulation layer TFE3 of the second area A2. Here, the minimum thickness of the third encapsulation layer TFE3 of each of the areas A1 and A2 may be defined as a minimum value of a length from one surface of the third encapsulation layer TFE3 to another surface of the third encapsulation layer TFE3 in the third direction DR3.

As described above, when a portion of the TFT layer TFTL is omitted in the light transmitting portion TA, a step difference may be provided between the light transmitting portion TA and the first pixel SP1, and thus a third encapsulation material layer coated on the first area A1 may flow into the light transmitting portion TA. Therefore, the minimum thickness of the third encapsulation layer TFE3 of the first area A1 may be less than the minimum thickness of the third encapsulation layer TFE3 of the second area A2. In an embodiment, the minimum thickness of the third encapsulation layer TFE3 of the first area A1 may be about 4 micrometers (μm) or less, and the minimum thickness of the third encapsulation layer TFE3 of the second area A2 may be about 8 μm or less, for example, but is not limited thereto.

The sensing layer SL may be disposed on the thin film encapsulation layer TFEL.

Since the sensing layer SL is disposed directly on the thin film encapsulation layer TFEL, the thickness of the display device 10 may be reduced in comparison with a case where a separate sensing panel including the sensing layer SL is attached on the thin film encapsulation layer TFEL, as described above.

The sensing layer SL may include a first sensing insulating layer SIL1, a first sensing conductive layer SCL1, a sensing contact layer SCNT, a second sensing conductive layer SCL2, and a sensing protective layer SPVX.

The first sensing insulating layer SIL1 may be disposed on the second encapsulation layer TFE2. The first sensing insulating layer SIL1 may be directly disposed on the second encapsulation layer TFE2 and may be in direct contact with one surface of the second encapsulation layer TFE2.

The first sensing insulating layer SIL1 may be disposed on the entire surface of the substrate SUB. That is, the first sensing insulating layer SIL1 may be disposed in the entire first area A1 and second area A2.

The first sensing conductive layer SCL1 is disposed on the first sensing insulating layer SIL1. The first sensing conductive layer SCL1 may include the connection electrode CE described above.

The sensing contact layer SCNT is disposed on the first sensing conductive layer SCL1. The sensing contact layer SCNT may insulate the first sensing conductive layer SCL1 from the second sensing conductive layer SCL2.

As described above, when the sensing contact layer SCNT includes an inorganic film, the sensing contact layer SCNT may not be disposed in the light transmitting portion TA in order to prevent a reduction of the transmittance of the light transmitting portion TA. Therefore, the sensing contact layer SCNT may not overlap the under panel sensors 720, 730, 740, and 750.

The second sensing conductive layer SCL2 is disposed on the sensing contact layer SCNT. The second sensing conductive layer SCL2 may include the described-above first sensing electrode TE and second sensing electrode RE, and the like. The second sensing conductive layer SCL2 may be electrically connected to the first sensing conductive layer SCL1 through a contact hole passing through the sensing contact layer SCNT.

In another embodiment, the first sensing conductive layer SCL1 may include the first sensing electrode TE and the second sensing electrode RE. In still another embodiment, the first sensing conductive layer SCL1 may include one of the first sensing electrode TE and the second sensing electrode RE, and the second sensing conductive layer SCL2 may include the other of the first sensing electrode TE and the second sensing electrode RE.

The sensing protective layer SPVX is disposed on the second sensing conductive layer SCL2. The sensing protective layer SPVX may be disposed on the entire surface of the substrate SUB. That is, the sensing protective layer SPVX may be disposed in the entire first area A1 and second area A2.

In addition, detailed description of the first sensing insulating layer SIL1, the first sensing conductive layer SCL1, the sensing contact layer SCNT, the second sensing conductive layer SCL2, and the sensing protective layer SPVX is described with reference to FIG. 12, and thus repetitive description is omitted.

The antireflection layer RFL is disposed on the sensing layer SL. Since the antireflection layer RFL may block external light reflection, a separate polarizer may be omitted. Therefore, the thickness of the display panel 300 may be minimized while preventing the luminance of the display device 10 from being lowered, as described above.

The antireflection layer RFL may include light blocking layers BM1 and BM2 and color filters CF1 and CF2. In an embodiment, the antireflection layer RFL may further include a planarization layer OC disposed on the color filters CF1 and CF2.

The light blocking layers BM1 and BM2 may be disposed on the sensing protective layer SPVX.

The light blocking layers BM1 and BM2 may include a light absorbing material or may be coated with a light absorbing agent to absorb light introduced from the outside. In this case, the light blocking layers BM1 and BM2 may include a carbon-based black pigment. However, the invention is not limited thereto, and the light blocking layers BM1 and BM2 may also include an opaque metal material such as chromium (Cr), molybdenum (Mo), an alloy of molybdenum and titanium (MoTi), tungsten (W), vanadium (V), niobium (Nb), tantalum (Ta), manganese (Mn), cobalt (Co), nickel (Ni) or any combinations thereof having high light absorption.

The light blocking layers BM1 and BM2 may overlap the pixel defining layers PDL1 and PDL2 in a thickness direction, that is, the third direction DR3.

The light blocking layers BM1 and BM2 may include a first light blocking layer BM1 disposed in the first area A1 and a second light blocking layer BM2 disposed in the second area A2.

The first light blocking layer BM1 may overlap the first pixel defining layer PDL1 in the thickness direction. In addition, the second light blocking layer BM2 may overlap the second pixel defining layer PDL2 in the thickness direction.

In an embodiment, a width of the first light blocking layer BM1 in one direction may be different from a width of the second light blocking layer BM2 in the one direction. In an embodiment, the width of the first light blocking layer BM1 in one direction may be greater than the width of the second light blocking layer BM2 in one direction, for example.

In an embodiment, the width of the first light blocking layer BM1 in one direction may be different from a width of the first pixel defining layer PDL1 in the one direction. In addition, the width of the second light blocking layer BM2 in the one direction may be different from a width of the second pixel defining layer PDL2 in the one direction. In an embodiment, the width of the first light blocking layer BM1 in the one direction may be less than the width of the first pixel defining layer PDL1 in the one direction, for example. In addition, the width of the second light blocking layer BM2 in the one direction may be less than the width of the second pixel defining layer PDL2 in the one direction. Here, the width of the light blocking layer BM1 (or BM2) in the one direction may mean a distance between ends of the light blocking layer BM1 (or BM2) where the ends are respectively adjacent to the color filters CF1 (or CF2).

When the width of the light blocking layers BM1 and BM2 in the one direction is less than the width of the pixel defining layers PDL1 and PDL2 in the one direction, since light emitted from the light emitting element layer EML may be minimized from being absorbed by the light blocking layers BM1 and BM2, a side luminance ratio may be improved and WAD may be improved.

However, when the width of the light blocking layers BM1 and BM2 become too small, since an external light absorbing function of the light blocking layers BM1 and BM2 is reduced, the width of the light blocking layers BM1 and BM2 may be adjusted in consideration of the side luminance ratio, the WAD, and the reflectance.

When the width of the light blocking layers BM1 and BM2 in the one direction is less than the width of the pixel defining layers PDL1 and PDL2 in the one direction, as shown in FIG. 13, predetermined gaps G1 and G2 may be defined between ends of the pixel defining layers PDL1 and PDL2 and ends of the light blocking layers BM1 and BM2.

Specifically, the display device 10 may include a first gap G1 defined by a length from an end of the first pixel defining layer PDL1 to an end of the first light blocking layer BM1 in one direction, and a second gap G2 defined as a length from an end of the second pixel defining layer PDL2 to an end of the second light blocking layer BM2 in one direction. Here, the first gap G1 may be defined as a length from an edge of an opening (e.g., a first opening O1) of the first pixel defining layer PDL1 to an edge of an opening of the first light blocking layer BM1 in the one direction. In addition, the second gap G2 may be defined as a length from an edge of an opening (e.g., a second opening O2) of the second pixel defining layer PDL2 to an edge of an opening of the second light blocking layer BM2 in the one direction.

In an embodiment, a width of the first gap G1 may be different from a width of the second gap G2. In an embodiment, a width of the first gap G1 may be less than a width of the second gap G2, for example.

Specifically, a width of the first gap G1 and a width of the second gap G2 may be determined based on the following Equation 1.

$$G2 = G1 + a \times D_{TFE3}$$ [Equation 1]

Here, G2 may represent a width of the second gap G2, G1 may represent a width of the first gap G1, DTFE3 may represent a difference between the minimum thickness of the third encapsulation layer TFE3 of the first area A1 and the minimum thickness of the third encapsulation layer TFE3 of the second area A2, and a may represent a variable set in a range of 0.4 to 0.6. In an embodiment, the variable a may be 0.5, for example, but is not limited thereto.

As described above, when a step difference occurs between the first area A1 and the second area A2 by the light transmitting portion TA, a thickness difference between the third encapsulation layer TFE3 of the first area A1 and the third encapsulation layer TFE3 of the second area A2 may be caused.

When the thickness of the third encapsulation layer TFE3 of the first pixel SP1 is different from the thickness of the third encapsulation layer TFE3 of the second pixel SP2, since a distance from the light emitting element layer EML of each of the pixels SP1 and SP2 to the antireflection layer RFL is different, an optical characteristic difference with respect to the viewing angle such as the side luminance ratio and the WAD in the first pixel SP1 and the second pixel SP2 may occur.

Therefore, the optical characteristic difference caused by the thickness difference of the third encapsulation layer TFE3 may be minimized, by designing the second gap G2 to be greater than the first gap G1 in consideration of the thickness difference of the third encapsulation layer TFE3 in the first pixel SP1 and the second pixel SP2.

The color filters CF1 and CF2 may be disposed on the light blocking layers BM1 and BM2.

One surface of the sensing protective layer SPVX exposed by the light blocking layers BM1 and BM2 may be defined as an opening (e.g., a third opening O3 and a fourth opening O4, respectively). The color filters CF1 and CF2 may be disposed in the opening defined by the light blocking layers BM1 and BM2. In this case, the color filters CF1 and CF2 may be in direct contact with the sensing protective layer SPVX in the opening. In addition, the color filters CF1 and CF2 may extend from an edge of the opening to an upper surface of the light blocking layers BM1 and BM2 and may be in direct contact with the upper surface of the light blocking layers BM1 and BM2.

The color filters CF1 and CF2 may include a first color filter CF1 disposed in the first area A1 and a second color filter CF2 disposed in the second area A2.

The first color filter CF1 may overlap the light emitting area of the first pixel SP1, and the second color filter CF2 may overlap the light emitting area of the second pixel SP2.

Specifically, the first color filter CF1 may include a first red color filter CF1R overlapping the light emitting area of the first sub pixel R of the first pixel SP1, a first green color filter CF1G overlapping the light emitting area of the second sub pixel G, and a first blue color filter CF1B overlapping the light emitting area of the third sub pixel B.

In addition, the second color filter CF2 may include a second red color filter CF2R overlapping the light emitting area of the first sub pixel R of the second pixel SP2, a second green color filter CF2G overlapping the light emitting area of the second sub pixel G, and a second blue color filter CF2B overlapping the light emitting area of the third sub pixel B.

According to the above-described embodiment, the optical characteristic difference may be minimized with respect to the viewing angle of the first area A1 and the second area A2, by differently designing the gaps G1 and G2 of the pixel defining layers PDL1 and PDL2 and the light blocking layers BM1 and BM2 in the first area A1 where the light transmitting portion TA is provided and the second area A2 which is the remaining area.

Hereinafter, a display device in another embodiment of the invention will be described. The same configurations as the configurations that are already described in the following embodiment will be referred to by the same reference numerals, and repetitive description will be omitted or simplified.

Figure 14:
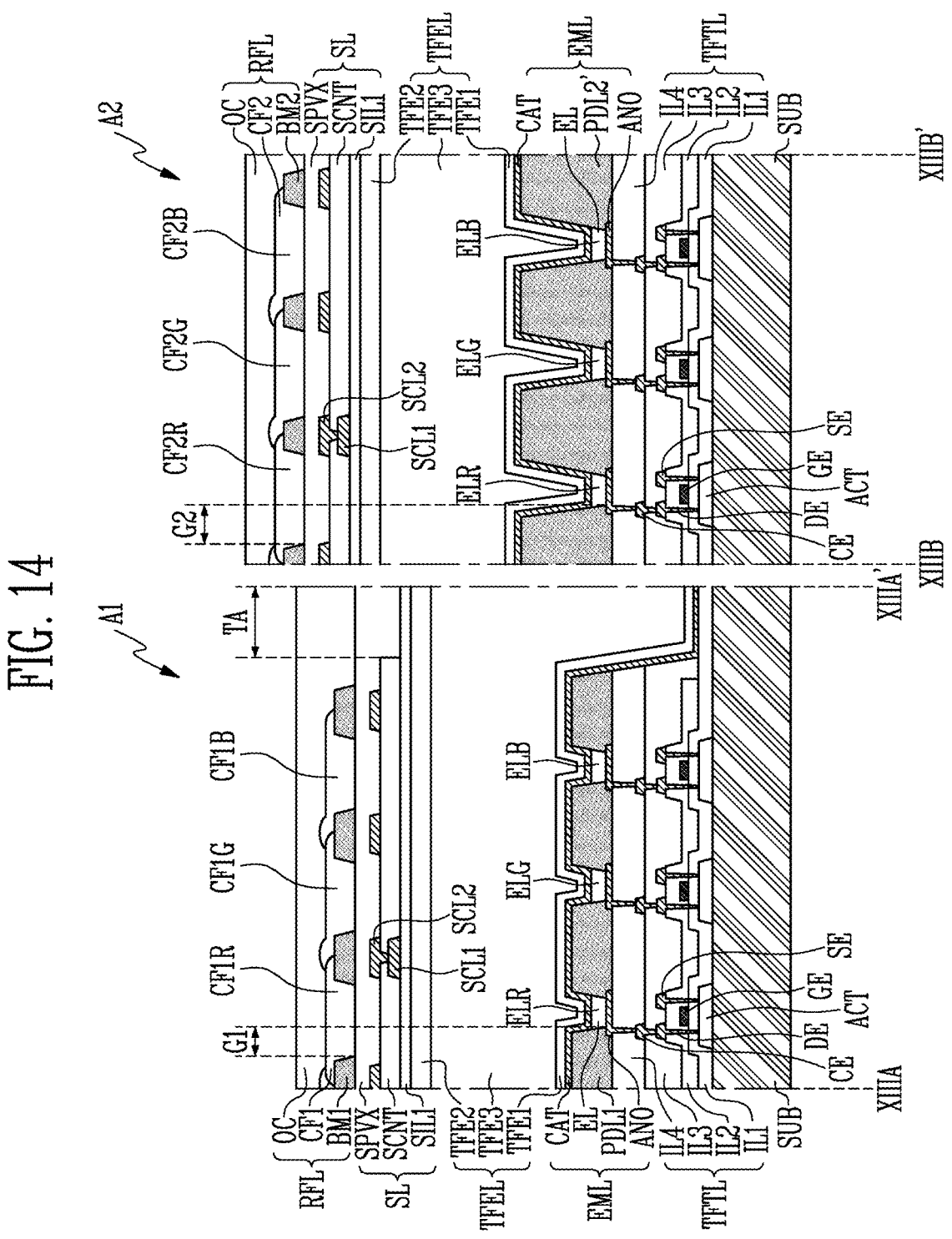
FIG. 14 is a cross-sectional view of another embodiment of a display device.

FIG. 14 is a cross-sectional view of another embodiment of a display device.

Referring to FIG. 14, the display device in the illustrated embodiment is different from the embodiment of FIGS. 1 to 13 in that thicknesses of a first pixel defining layer PDL1 and a second pixel defining layer PDL2' are different from each other.

According to the embodiment of FIG. 13, an optical characteristic variation with respect to the viewing angle of the first area A1 and the second area A2 may be improved according to the thickness difference of the third encapsulation layer TFE3, optical characteristic deviation issue with respect to reflectance may occur.

In the illustrated embodiment, the thickness of the second pixel defining layer PDL2' may be greater than the thickness of the first pixel defining layer PDL. In an embodiment, when the thickness of the first pixel defining layer PDL1 is about 1.2 μm to about 1.8 μm, the thickness of the second pixel defining layer PDL2' may be about 1.6 μm to about 2.4 μm, for example, but is not limited thereto.

When the thickness of the second pixel defining layer PDL2' is relatively large, even though the width of the second light blocking layer BM2 is relatively small, since an external light absorption rate by the second pixel defining layer PDL2' may be increased, a reflectance difference between the first area A1 and the second area A2 may be minimized.

Since a cross-sectional structure of the display device except for the above-described difference is described with reference to FIGS. 1 to 13, repetitive description is omitted.

Figure 15:
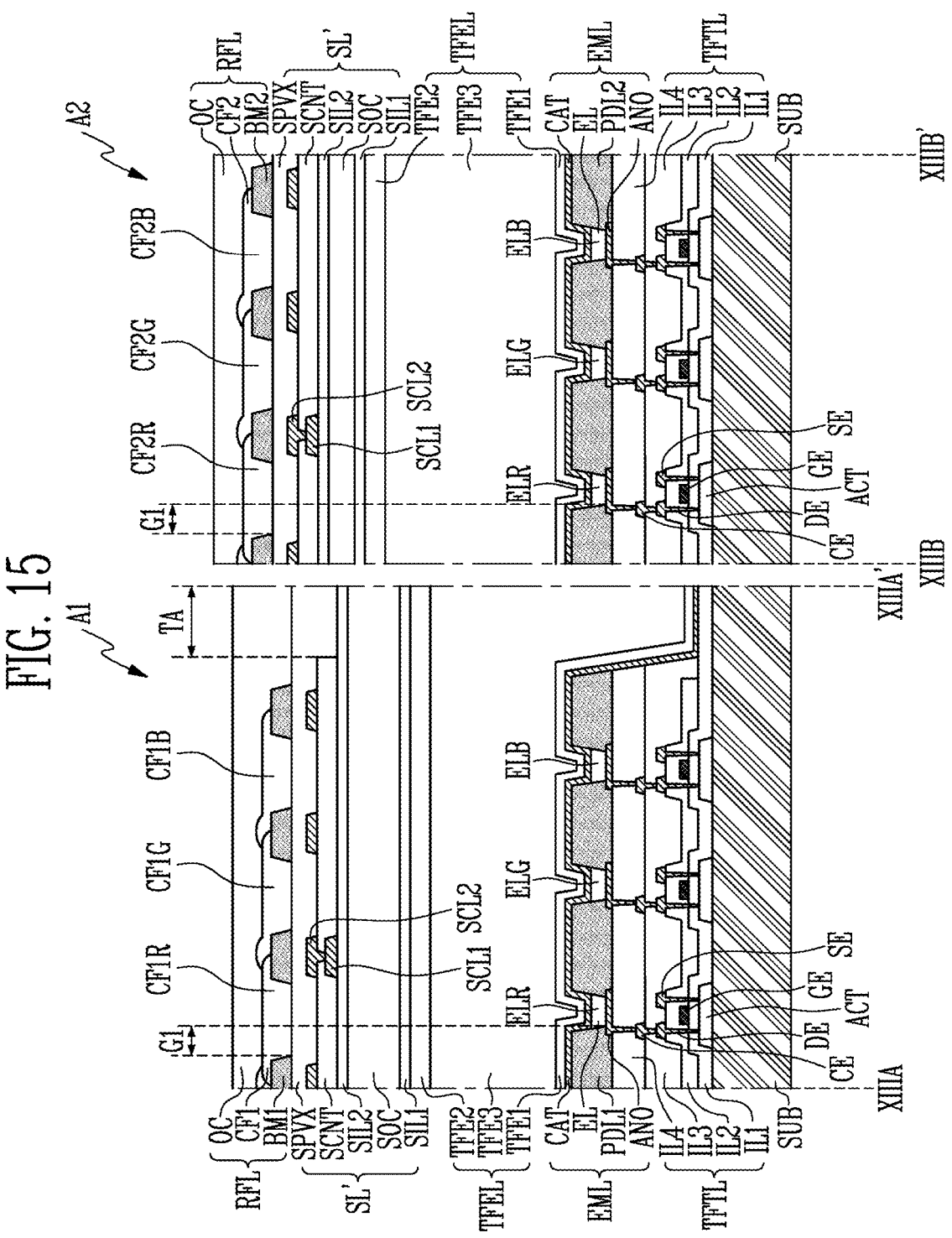
FIG. 15 is a cross-sectional view of another embodiment of a display device.

FIG. 15 is a cross-sectional view of another embodiment of a display device.

Referring to FIG. 15, the display device in the illustrated embodiment is different from the embodiment of FIGS. 1 to 13 in that a sensing layer SL' further includes a second sensing insulating layer SIL2 and a sensing planarization layer SOC.

Specifically, the second sensing insulating layer SIL2 may be disposed between the first sensing insulating layer SIL1 and the first sensing conductive layer SCL1.

The second sensing insulating layer SIL2 may be disposed on the entire surface of the substrate SUB. That is, the second sensing insulating layer SIL2 may be disposed in the entire first area A1 and second area A2.

The second sensing insulating layer SIL2 may include the same material as that of the first sensing insulating layer SIL1, or may include one or more materials including at least one of materials exemplified as configuration materials of the first sensing insulating layer SIL1.

The sensing planarization layer SOC may be disposed between the first sensing insulating layer SIL1 and the second sensing insulating layer SIL2.

One surface of the sensing planarization layer SOC may be in direct contact with the first sensing insulating layer SIL1, and another surface of the sensing planarization layer SOC may be in direct contact with the second sensing insulating layer SIL2.

The sensing planarization layer SOC may be disposed on the entire surface of the substrate SUB. That is, the sensing planarization layer SOC may be disposed in the entire first area A1 and second area A2.

The sensing planarization layer SOC may planarize a thickness difference of the thin film encapsulation layer TFEL of the first area A1 and the second area A2 due to the light transmitting portion TA.

A thickness of the sensing planarization layer SOC of the first area A1 may be different from the thickness of the sensing planarization layer SOC of the second area A2.

In an embodiment, the thickness of the sensing planarization layer SOC of the first area A1 may be greater than the thickness of the sensing planarization layer SOC of the second area A2, for example, but is not limited thereto.

The sensing planarization layer SOC may include the same material as that of the sensing protective layer SPVX, or may include one or more materials including at least one of materials exemplified as configuration materials of the sensing protective layer SPVX. The sensing planarization layer SOC may include an organic film, but is not limited thereto.

As described above, when the sensing layer SL' includes the sensing planarization layer SOC, the thickness difference of the thin film encapsulation layer TFEL of the first area A1 and the second area A2 may be compensated. That is, since a distance difference from the light emitting element layer EML to the antireflection layer RFL of each of pixels SP1 and SP2 may be minimized, the optical characteristic difference such as the side luminance ratio and the WAD between the first area A1 and the second area A2 may be minimized.

In addition, when the distance difference from the light emitting element layer EML to the antireflection layer RFL of each of the pixels SP1 and SP2 is minimized, the first gap G1 and the second gap G2 may be substantially the same. That is, since the width of the first light blocking layer BM1 and the width of the second light blocking layer BM2 may be substantially the same, a reflectance difference between the first area A1 and the second area A2 may be minimized.

Since a cross-sectional structure of the sensing layer SL' except for the above-described difference is described with reference to FIGS. 1 to 13, repetitive description is omitted.

Figure 16:
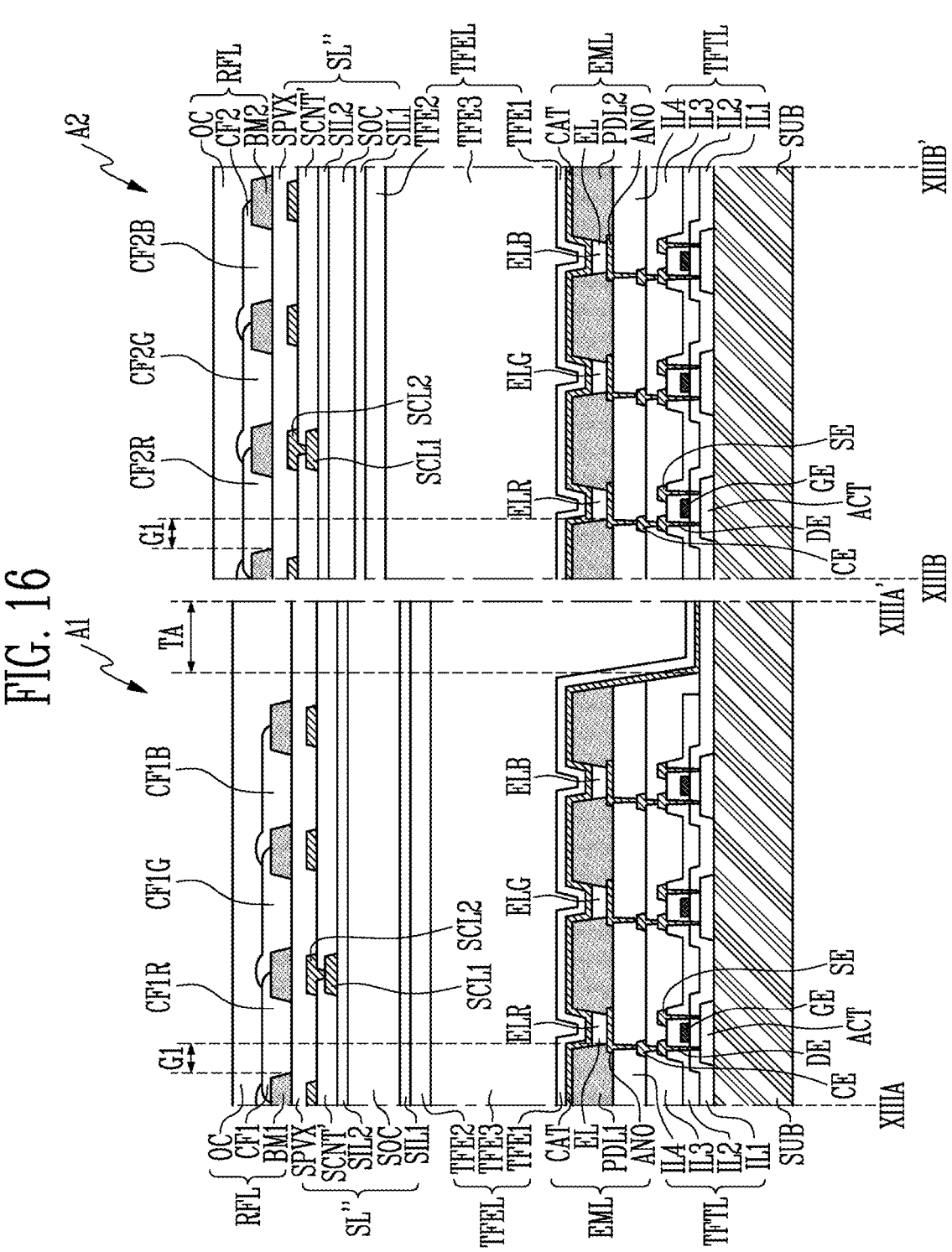
FIG. 16 is a cross-sectional view of another embodiment of a display device.

FIG. 16 is a cross-sectional view of another embodiment of a display device.

Referring to FIG. 16, the display device in the illustrated embodiment is different from the embodiment of FIG. 15 in that a sensing contact layer SCNT' overlaps the light transmitting portion TA.

The sensing contact layer SCNT' may include the same material as that of the above-described sensing planarization layer SOC and/or the sensing protective layer SPVX, or may include one or more materials including at least one of the materials exemplified as configuration materials of the sensing planarization layer SOC and/or the sensing protective layer SPVX. In an embodiment, the sensing contact layer SCNT' may include an organic film, for example, but is not limited thereto.

When the sensing contact layer SCNT' includes the organic film, the sensing contact layer SCNT' may be disposed on the entire surface of the substrate SUB. The sensing contact layer SCNT' may be disposed in the entire first area A1 and second area A2.

In addition, the sensing contact layer SCNT' may overlap the light transmitting portion TA. That is, the sensing contact layer SCNT' may overlap the under panel sensors 720, 730, 740, and 750 in the thickness direction.

The sensing contact layer SCNT' may additionally planarize the thickness difference of the thin film encapsulation layer TFEL of the first area A1 and the second area A2 due to the light transmitting portion TA. Since the thickness difference of the thin film encapsulation layer TFEL of the first area A1 and the second area A2 may be compensated by the sensing planarization layer SOC, the optical characteristic difference between the first area A1 and the second area A2 may be minimized as described above.

In addition, since the distance difference from the light emitting element layer EML to the antireflection layer RFL of each of the pixels SP1 and SP2 may be minimized by the sensing contact layer SCNT', the first gap G1 and the second gap G2 may be substantially the same. That is, since the width of the first light blocking layer BM1 and the width of the second light blocking layer BM2 may be substantially the same, the reflectance difference between the first area A1 and the second area A2 may be minimized as described above.

Since a cross-sectional structure of the sensing layer SL" except for the above-described difference is described with reference to FIGS. 1 to 13, repetitive description is omitted.

Those skilled in the art may understand that the invention may be implemented in a modified form without departing from the above-described essential characteristic. Therefore, the disclosed methods should be considered in a description point of view not a limitation point of view. The scope of the invention is not limited to the above description, and various modifications may be available within a concept of the invention.

What is claimed is:

1. A display device comprising:
   a sensor;
   a display panel including a first area overlapping the sensor and a second area not overlapping the sensor, the display panel comprising:
   a first electrode in the first area;
   a second electrode in the second area;
   a pixel defining layer including a first opening exposing a portion of the first electrode and a second opening exposing a portion of the second electrode;
   a thin film encapsulation layer covering the light emitting element layer;

a sensing layer disposed on the thin film encapsulation layer, and including:
   sensing electrodes;
   a first insulating layer;
   a second insulating layer disposed on the first insulating layer; and
   a planarization layer disposed between the first insulating layer and the second insulating layer; and
   a light blocking layer disposed on the pixel defining layer and including a third opening overlapping the first opening and a fourth opening overlapping the second opening,
   wherein
   a width of the light blocking layer in the first area in a first direction is different from a width of the pixel defining layer in the first area in a first direction, and
   a thickness of the thin film encapsulation layer in a first area is different from a thickness of the thin film encapsulation layer in a second area.

2. The display device according to claim 1, wherein the sensing layer further including:
   a first conductive layer disposed on the second insulating layer;
   a second conductive layer disposed on the first conductive layer; and
   a contact layer disposed between the first conductive layer and the second conductive layer, and
   the second conductive layer is electrically connected to the first conductive layer through a contact hole passing through the contact layer.

3. The display device according to claim 2, wherein the contact layer does not overlap the sensor.

4. The display device according to claim 2, wherein the contact layer and the planarization layer include a same material.

5. The display device according to claim 4, wherein the contact layer overlaps the sensor.

6. The display device according to claim 5, wherein the sensing layer further includes a protective layer disposed between the second conductive layer and the light blocking layer, and
   the protective layer includes a material identical to the same material of the contact layer and the planarization layer.

7. The display device according to claim 1, wherein a thickness of the planarization layer of the first area is greater than a thickness of the planarization layer of the second area.

* * * * *